United States Patent [19]
Burnett et al.

[11] Patent Number: 5,604,891
[45] Date of Patent: Feb. 18, 1997

[54] 3-D ACOUSTIC INFINITE ELEMENT BASED ON A PROLATE SPHEROIDAL MULTIPOLE EXPANSION

[75] Inventors: David S. Burnett, Roxbury; Richard L. Holford, Denville, both of N.J.

[73] Assignee: Lucent Technologies Inc., Murray Hill, N.J.

[21] Appl. No.: 330,160

[22] Filed: Oct. 27, 1994

[51] Int. Cl.$^6$ ..................................................... G06F 17/16
[52] U.S. Cl. ........................ 395/500; 395/119; 364/578; 364/803; 364/724.03
[58] Field of Search ..................... 395/500, 800, 395/140, 141, 119, 120, 125, 123; 364/578, 572, 801, 803, 724.03, 724.05, 725, 735

[56] References Cited

U.S. PATENT DOCUMENTS

| | | | |
|---|---|---|---|
| 5,285,393 | 2/1994 | Abele et al. | 364/468 |
| 5,287,529 | 2/1994 | Pentland | 395/800 |
| 5,315,537 | 5/1994 | Blacker | 364/578 |
| 5,471,435 | 11/1995 | Marschall | 367/135 |

OTHER PUBLICATIONS

Ren et al., "Comparison of Different Boundary Integral Formulations when Coupled with Finite Elements in Three Dimensions", IEEE 1988, pp. 501–507.

Yaccarino et al., "Application of Spherical Wave Expansions to Reflector Antennas Using Truncated Field Data", IEEE 1991, pp. 639–644.

Yuan, "Three–Dimensional Electromagnetic Scattering from Inhomogeneous Objects by the Hybrid Moment and Finite Element Method,", IEEE 1990, pp. 1053–1058.

Werby et al., "Broadside Resonance Scattering from Elastic Spheroids", IEEE 1989, pp. 400–406.

*Primary Examiner*—Kevin J. Teska
*Assistant Examiner*—Tan Nguyen
*Attorney, Agent, or Firm*—Martin I. Finston

[57] ABSTRACT

In an improvement over conventional finite element techniques, a prolate spheroidal infinite element is used for the modeling of acoustic fields in exterior, fluid-filled domains surrounding a structure. This prolate infinite element is based on a multipole expansion that describes, to arbitrary accuracy, any scattered and/or radiated field exterior to a prolate spheroid of any eccentricity. The prolate infinite element is readily incorporated in any structural or acoustical finite element code. Structural acoustic modeling with the element is several orders of magnitude faster than modeling, at comparable accuracy, with the well-known and widely used boundary element method, at least for large-scale problems involving tens of thousands of degrees of freedom.

8 Claims, 9 Drawing Sheets

3-D ACOUSTIC INFINITE ELEMENT BASED ON A PROLATE SPHEROIDAL MULTIPOLE EXPANSION

GOVERNMENT CONTRACT

This invention was made with Government support. The government has certain rights in this invention.

BACKGROUND OF THE INVENTION

In the field of computational structural acoustics, the problem of efficiently modeling the acoustic field in large exterior domains has remained a difficult challenge for over a quarter century. Many techniques have evolved. Those historically receiving greatest attention in the literature are: the boundary integral equation method or, as it is often called, the boundary element method (BEM), which is based on the surface Helmholtz integral equation applied to the surface of the structure; and infinite elements, which are based on the Helmholtz differential equation (the reduced wave equation), applied to semi-infinite sectors of the domain that are exterior to an artificial boundary surrounding the structure, with finite elements between the structure and the boundary.

The BEM is the method of choice for most researchers and code developers. Its primary advantage is that it is based on a mathematically rigorous formulation, namely, the Helmholtz integral representation, that (i) satisfies the Sommerfield radiation condition and (ii) represents the exact solution throughout the exterior domain. In addition, its reduction of the dimensionality of the problem by one has long been thought to be a significant computational advantage. However, we have found that this is actually disadvantageous because of the much greater bandwidth of the equations, due to the inherent global connectivity of the method.

By contrast, infinite elements were hitherto never intended to represent the exact solution, or even an approximate solution, within the element itself. Based on ad hoc physical assumptions or asymptotic theories, they were only meant to provide an approximate non-reflecting condition on an artificial boundary surrounding the structure, thereby enabling a sufficiently accurate solution to be obtained in the finite region interior to the boundary. The solution exterior to the boundary is then usually obtained from the exterior Helmholtz integral, using the pressure and velocity data computed on the surface of the structure.

Two types of infinite elements have previously been used for acoustic applications: the exponential decay and the "mapped" element.

The exponential decay element approximates the spatial decay of the acoustic pressure amplitude by an exponential, $p \propto e^{-\gamma r} e^{-ikr}$, where $\gamma$ is an empirically adjusted positive number and r is any coordinate that extends to infinity. Because this decay function is inconsistent with acoustical theory, the accuracy rapidly deteriorates away from the artificial boundary.

The mapped element is based on the asymptotic form of the field for large r, using the leading terms of the lower order spherical Hankel functions, namely, $$p \propto \left( \frac{a_1}{r} + \frac{a_2}{r^2} + \ldots \right) e^{-ikr}.$$

Because of the mapping, the element was intended to be usable in any shape and orientation, i.e., not necessarily aligned with spherical coordinate surfaces, thereby permitting the "radial" sides of different elements to emanate from different spherical origins.

However, we have found that for this representation to converge, (i) the elements must lie outside the smallest sphere circumscribing the structure, and (ii) the sides of all elements in a mesh must conform to radial lines emanating from the origin of the single r coordinate in the expansion. Since the fluid region between the circumscribing sphere and the structure must be meshed with finite-size acoustic elements, the total acoustic mesh would become very large and therefore computationally very inefficient for structures of large aspect ratio. Thus, the element is practical only for "chunky" structures, i.e., those that can be closely circumscribed by a sphere. This is a serious limitation for many applications.

An additional problem of the mapped element is that element generation is relatively expensive. Moreover, generation of the matrices for the mapped element requires inversion of an ill-conditioned matrix. This causes quadrature problems at very high frequencies.

SUMMARY OF THE INVENTION

The spheroidal infinite element described in this paper breaks with tradition in that it is based on a mathematically rigorous formulation, namely, a new multipole expansion (a power series in 1/r, where r is a prolate spheroidal radius) that (i) satisfies the Sommerfeld radiation condition and (ii) represents the exact solution throughout the domain exterior to a minimal circumscribing prolate spheroid. When the leading terms of the expansion, a polynomial in 1/r multiplied by an oscillatory factor, are incorporated in an infinite element, accuracy may be increased arbitrarily throughout the element by increasing the number of terms in the polynomial, analogous to p-extension in conventional polynomial-based finite elements.

The spheroidal element improves on the mapped element by removing all of the aforementioned practical limitations. It (i) eliminates the 3-D mapping that mixes together the (troublesome) infinite direction with the (well-behaved) finite directions, (ii) generalizes the circumscribing sphere to a circumscribing spheroid in order to accommodate structures of both large and small aspect ratios and (iii) takes advantage of separable coordinates to reduce the 3-D integrals to products of much more cheaply computed 2-D and 1-D integrals, which simultaneously eliminates the ill conditioning.

We believe that the inventive technique is probably the most efficient technique now available for large computational structural acoustics problems. In addition, the technique used for this acoustic element can be applied to other types of wave propagation such as electromagnetism and elastodynamics.

Our new element is readily incorporated in any structural finite element code. We have, in fact, implemented the inventive technique and incorporated this new element in such a code, which is referred to below as our exemplary IEM code. We have tested this code on a variety of problems to validate its accuracy, as discussed below.

Finite element codes, in general, are well known and need not be described here in detail. Numerous books are available on this subject, including D. S. Burnett, *Finite Element Analysis,* Addison-Wesley, Reading, Mass., 1987 (reprinted 1988), which is hereby incorporated by reference.

OVERVIEW OF THE FINITE ELEMENT METHOD

Figure 1:
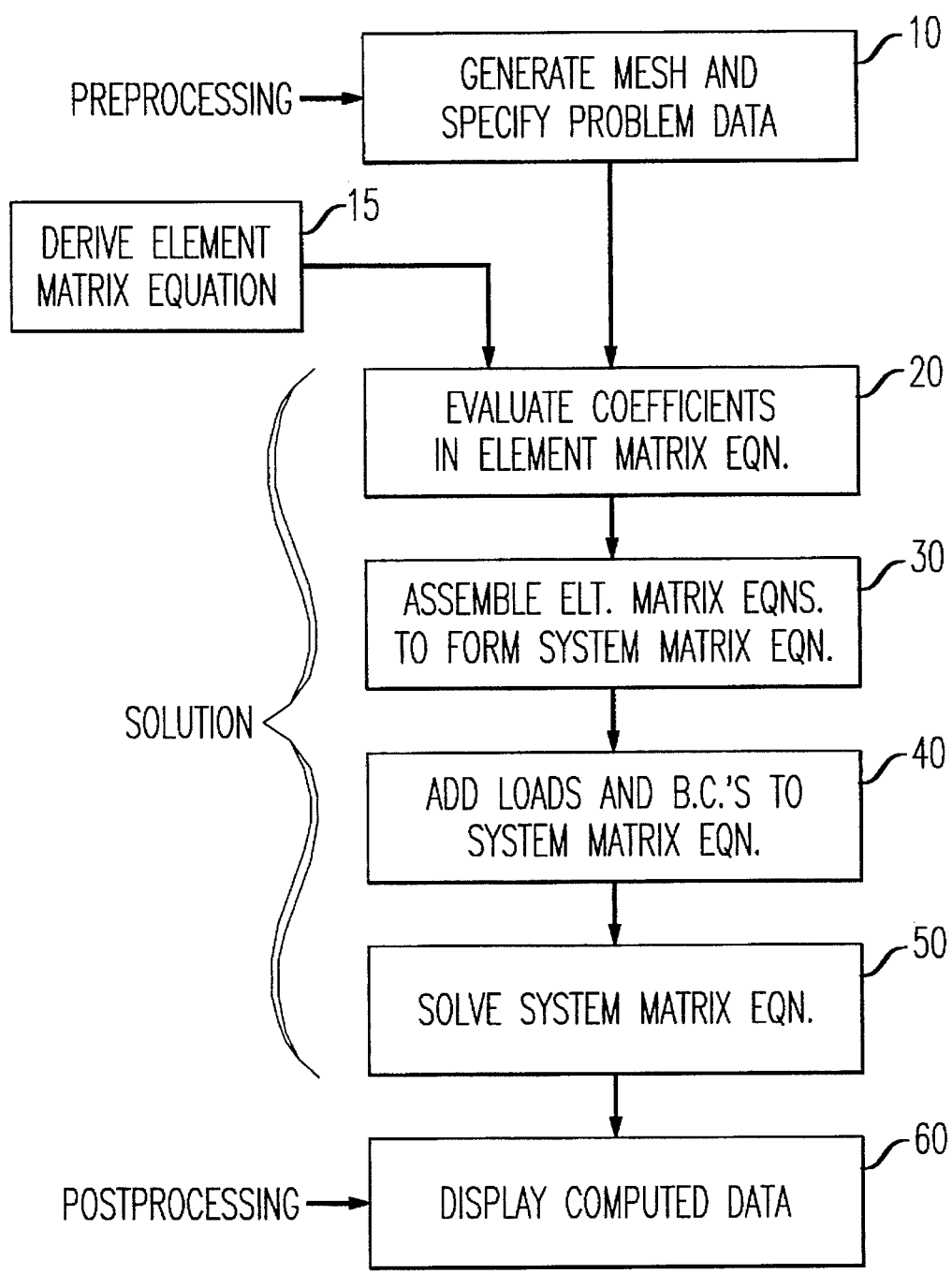
FIG. 1 is a flowchart illustrating the basic steps in the use and operation of a finite element code.

The finite element method (FEM) is a method, performed with the help of a computer, for predicting the behavior of a physical system by obtaining numerical solutions to mathematical equations that describe the system and its loading conditions. The use of the FEM may be thought of as comprising three phases: preprocessing, solution, and post-processing. These phases are now discussed in further detail with reference to FIG. 1.

In the preprocessing phase, the physical domain of the problem is partitioned into a pattern of subdomains of simple geometry, referred to as "elements". The resulting pattern is referred to as a "mesh". In addition, problem data such as physical properties, loads, and boundary conditions are specified. This procedure is represented as step 10 of the figure.

The solution phase comprises steps 20–50 in the figure. In the first of these four steps, numerical values are computed for the coefficients in the "element matrix equation" associated with each element in the mesh. The element matrix equation, the derivation of which is indicated in box 15 of the figure, is a set of numerically computable mathematical formulas that are derived theoretically and implemented into the computer code that forms the FEM program.

During the use of the FEM program, the code for these formulas is accessed by each element in the mesh, and numerical values are computed for the coefficients in the formulas using the geometric and physical data associated with each element.

We are providing, for the first time, a set of such formulas (i.e., the element matrix equation) that is specific to a prolate spheriodal acoustic infinite element.

The procedure used in the derivation of the element matrix equation, which is described in detail below, embodies the following general ideas. The unknown field variable, for which the finite-element analysis is seeking a solution (such as the acoustic pressure), is represented approximately within each element as a finite sum of known functions, referred to as "shape" functions. These shape functions are usually chosen to be polynomials. There are unknown parameters in this representation, referred to as "degrees of freedom (DOF)", that become the new unknowns which the finite-element analysis will find values for. The DOF are often the values that the unknown field variable takes at specific points in the element, referred to as "nodes". The purpose of this representation is that when values for the DOF are subsequently computed in step 50, a solution will then be known everywhere, continuously, throughout each element. This is possible because at that stage, both the shape functions and the parameters will be known, and these, together, define the complete solution.

The representation of the unknown field variable in terms of shape functions is then inserted into the governing physics equations (which are, typically, differential or integral equations) that express the physical laws to which the physical system is subject. These calculus equations reduce to a system of linear algebraic equations which, when written in matrix form, is the element matrix equation. The expressions for the coefficients in this matrix equation are manipulated using calculus and algebra until they are in a form that can be numerically evaluated by the computer. These numerical coefficients are the output of step 20.

In step 30, the element matrix equations from all the elements are combined together (i.e., they are said to be "assembled") into one large "system matrix equation." The matrices associated with elements that touch each other in the mesh will partially overlap, thereby establishing continuity in the field variable from element to element. Since the overlap is partial, the system matrix grows larger and larger as element equations are assembled, resulting in one very large system matrix.

The system matrix equation is then modified (step 40) to take account of the boundary and loading conditions. The system matrix equation is then solved (step 50), using conventional techniques of numerical analysis. Although there may be thousands, or even hundreds of thousands, of unknown DOF, the solution of this matrix equation is generally a very tractable problem. That is because the matrix elements tend to assume non-zero values only within a relatively narrow band along the matrix diagonal. A well-known measure of the width of this band (and thus, of the time required for solution) is the "rms half-bandwidth" $B_{rms}$.

In the postprocessing phase, the solution to the system matrix equation is displayed in an appropriate, meaningful form (step 60). In this phase, other useful information may be derived from the solution and likewise displayed. The following section presents a detailed description of the derivation of the element matrix equation for the inventive prolate spheroidal acoustic infinite element.

DETAILED DESCRIPTION

A. The Classical Expansion Exterior to a Sphere

Figure 2:
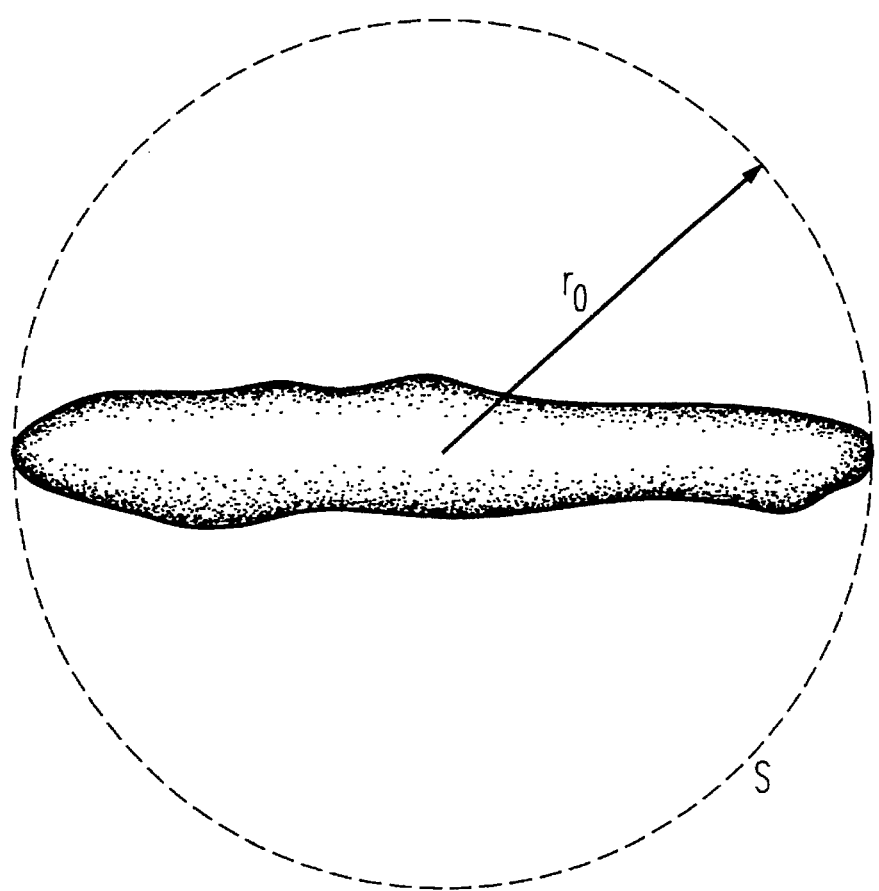
FIG. 2 depicts an arbitrary, prolate structure together with its smallest circumscribing sphere S, having radius $r_0$.
Figure 3A:
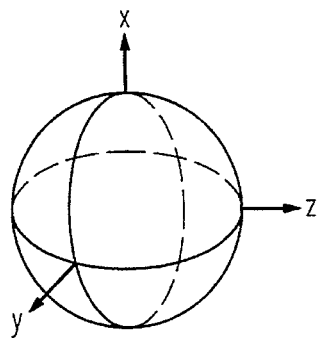
FIGS. 3a–3d depict the closed coordinate surfaces of four orthogonal coordinate systems. These surfaces are: (a) sphere; (b) prolate spheroid; (c) oblate spheroid; and (d) ellipsoid.
Figure 3B:
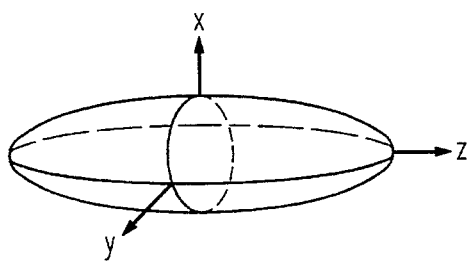
Figure 3C:
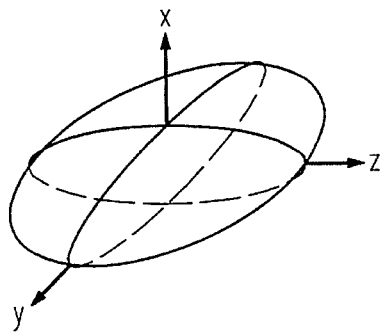
Figure 3D:
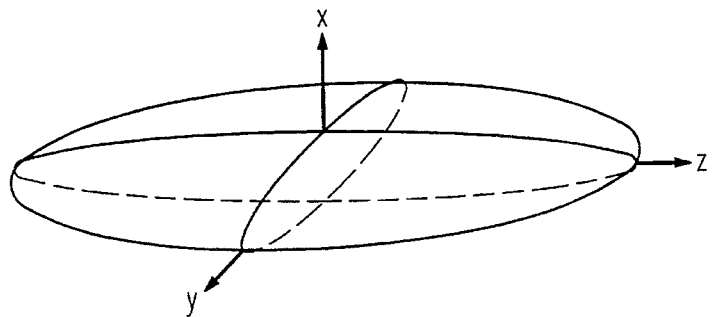

Consider an arbitrary structure immersed in an infinite homogeneous fluid and vibrating at constant frequency $\omega$ (FIG. 2). Let S be a sphere of minimum radius $r_0$ that just circumscribes the structure, as shown in FIG. 2. It is well known that the scattered and/or radiated pressure p exterior to S can be represented by the following multipole expansion in spherical coordinates r,$\theta$,$\phi$:

$$p = \frac{e^{-ikr}}{r} \sum_{n=0}^{\infty} \frac{F_n(\theta,\phi;k)}{r^n}, \quad (1)$$

where k is acoustic wavenumber, the $F_n$ are smooth, differentiable functions, and the series converges in $r>r_0$.

Since Eq. (1) is valid only outside a circumscribing sphere, then infinite elements based on Eq. (1) should only lie outside a circumscribing sphere. The region between the structure and the sphere must therefore be filled with finite-size acoustic elements. This limits the usefulness of such infinite elements to structures that are "chunky", i.e., that fill up most of the space inside a sphere. Long and/or flat structures would need an excessive number of finite-size elements (or DOF for p-type elements) to fill the space. Therefore a different multipole expansion is needed, one that is appropriate for non-chunky structures. Since multipole expansions are limited to a specific coordinate system (because they provide an explicit functional form for the "radial" coordinate that goes to infinity), the first step is to select an appropriate coordinate system.

B. Coordinate Systems for Different Aspect Ratios

The closed coordinate surfaces relating, respectively, to four orthogonal coordinate systems are shown in FIG. 3. They are all ellipsoids, i.e., quadric surfaces for which the three orthogonal principal cross-sections are ellipses, including circles as a degenerate form. The most general case, involving three different elliptical cross-sections, is case (d). The others are given special names: spheres, prolate spheroids and oblate spheroids. Prolate and oblate spheroids are generated by rotating ellipses about their major and minor axes, respectively.

Prolate spheroidal coordinates can closely circumscribe any structure for which two dimensions are similar and the third comparable or greater, i.e., structures that vary from "chunky" to "long". The applications of interest herein involve long (or chunky) structures, for which the appropriate coordinate system is prolate spheroidal. Therefore, described below is the development of a prolate spheroidal infinite element.

C. A New Expansion Exterior to a Prolate Spheroid

1. Prolate Spheroidal Coordinates

Figure 4:
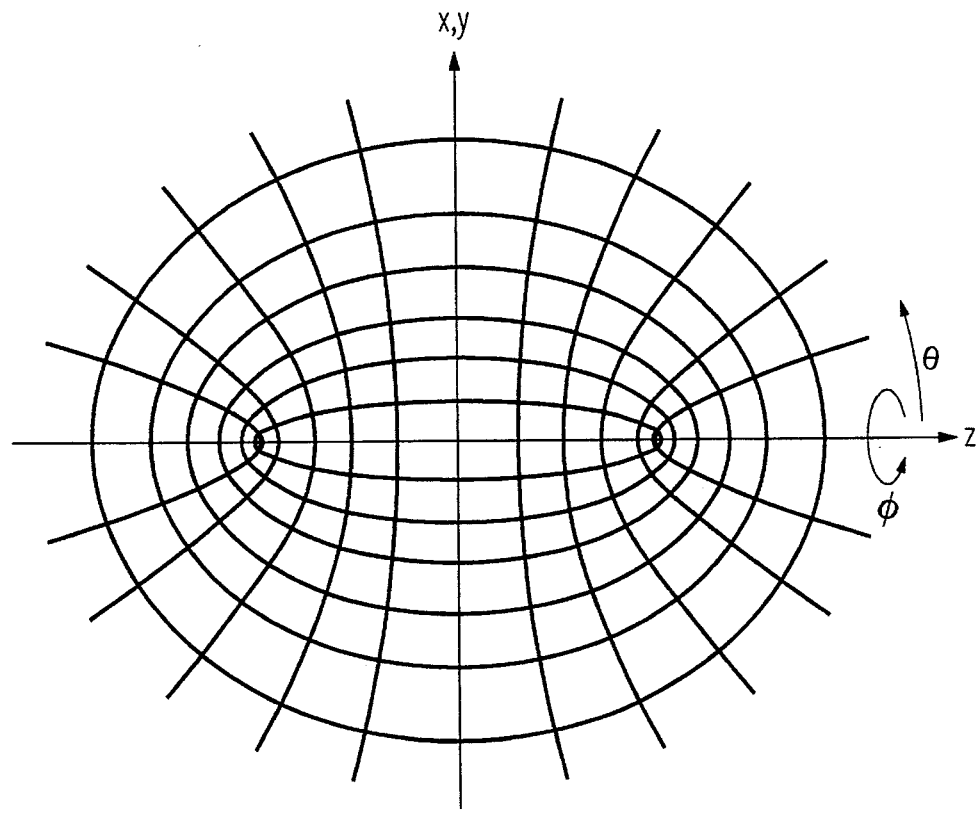
FIG. 4 depicts a set of confocal ellipses and hyperbolas. When rotated about the z-axis, these curves form the spheroidal and hyperboloidal surfaces, respectively, of the prolate spheroidal coordinate system.

FIG. 4 shows a family of confocal ellipses and hyperbolas, which are orthogonal. When rotated about the major axis of the ellipses (the z-axis), the curves become quadric surfaces, called, respectively, prolate spheroids and two-sheeted hyperboloids. Combined with planes through the z-axis, these orthogonal surfaces are the coordinate surfaces comprising the prolate spheroidal system.

Figure 5:
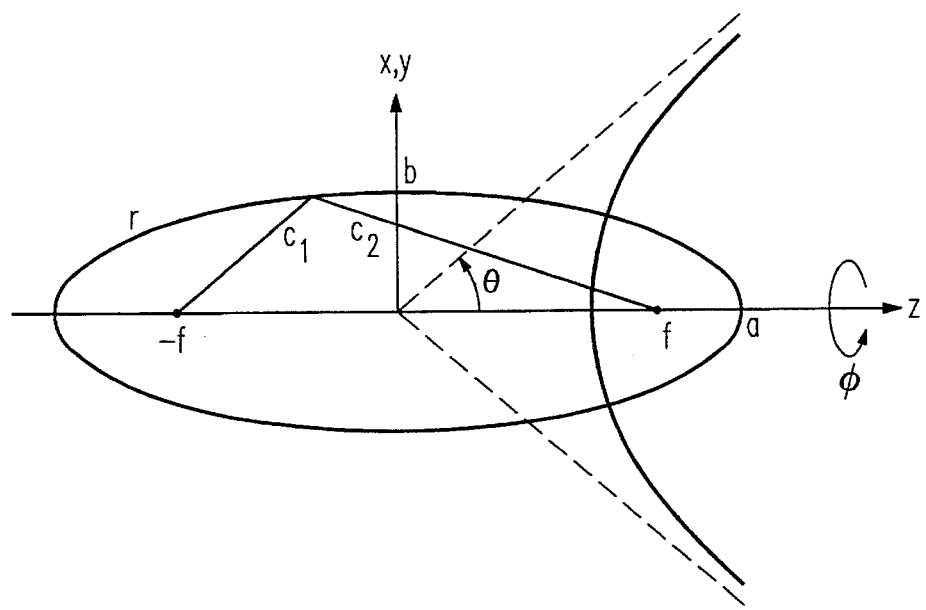
FIG. 5 illustrates the prolate spheroidal coordinates r, $\theta$, and $\phi$, and related geometric parameters. In the figure, the prolate radius r is defined as $$\frac{1}{2}(c_1 + c_2).$$

FIG. 5 defines the parameters relevant to the prolate spheroidal coordinates r, $\theta$, $\phi$:

$$r = \text{prolate radius} = \frac{c_1 + c_2}{2} \quad (2)$$

$\theta$=polar angle=half angle of asymptotic cone of hyperboloid
$\quad (0 \leq \theta \leq \pi)$ $\phi$=circumferential angle, about z axis, same as spherical $\phi$
$\quad (0 \leq \phi < 2\pi) \quad (3)$ $2f =$ interfocal distance; foci at $z = \pm f \quad (4)$
$a =$ semi-major axis $= r$ $b =$ semi-major axis $= \sqrt{r^2 - f^2} \quad (r \geq f)$ $\epsilon =$ eccentricity of spheroid $= \frac{f}{r}$ Surfaces of constant r are confocal spheroids, constant-$\theta$ surfaces are confocal two-sheeted hyperboloids, and constant-$\phi$ surfaces are planes containing the z-axis.

The transformation from Cartesian to prolate spheroidal coordinates is as follows:

$$x = \sqrt{r^2 - f^2} \sin\theta\cos\phi, \; y = \sqrt{r^2 - f^2} \sin\theta\sin\phi, \; z = r\cos\theta \quad (5)$$

2. A Prolate Spheroidal Multipole Expansion

Figure 6:
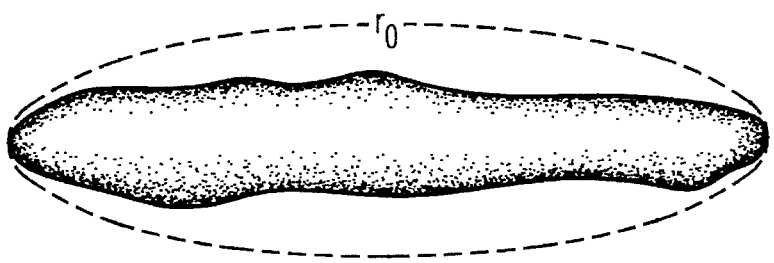
FIG. 6 depicts an arbitrary, prolate structure and a minimal circumscribing prolate spheroid S, with prolate radius $r_0$.

Consider the same structure as in FIG. 2, but now let S be a prolate spheroid of minimal prolate radius $r_0$ that just circumscribes the structure (FIG. 6). The scattered and/or radiated pressure p exterior to S can be represented by the following multipole expansion in prolate spheroidal coordinates r, $\theta$, $\phi$:

$$p = \frac{e^{-ikr}}{r} \sum_{n=0}^{\infty} \frac{G_n(\theta,\phi;k)}{r^n} \quad (6)$$

with properties similar to Eq. (1). The series in Eq. (6) converges absolutely and uniformly in r,$\theta$ and $\phi$ in any region $r \geq r_0 + \epsilon > r_0$. There is a six term recursion formula that defines the functions $G_n(\theta,\phi;k)$ in terms of $G_0(\theta,\phi;k)$.

Eq. 6 is a generalization of Eq. (1), including the latter as a special case. Whereas Eq. (5) is appropriate for a wide range of shapes, varying from chunky to arbitrarily long, Eq. (1) is only appropriate for chunky shapes. Stated geometrically, prolate spheroids have a wide range of shapes but spheres have only one.

The appropriateness of Eq. (6) for long structures can be seen by considering the difference in radial response along the major and minor axes of the prolate spheroidal coordinates. Along the major axis the prolate radial coordinate, r, is the distance from the origin, a; hence, r is the same as the spherical radius. In any other direction r is not the distance from the origin. In particular, along the minor axis b is the distance from the origin. Since $r=\sqrt{b^2+f^2}$, then close to the structure, where $b/f \ll 1$, $dr/db \cong b/f$. Thus, r is changing more slowly than b. This can be appreciated by reexamining FIG. 4; since spheroids are surfaces of constant r, a $1/r^n$ decay is spread over greater radial distances at $\theta=\pi/2$ than at $\theta=0$. In short, the spatial rate of decay in the radial direction in Eq. (6) is like spherical spreading along the major axis, but close to the side of a long structure the decay is slower, similar to cylindrical (2-D) spreading, as one might expect. In the far field, a, b, and r approach equality, so the decay approaches spherical spreading in all directions.

Figure 7:
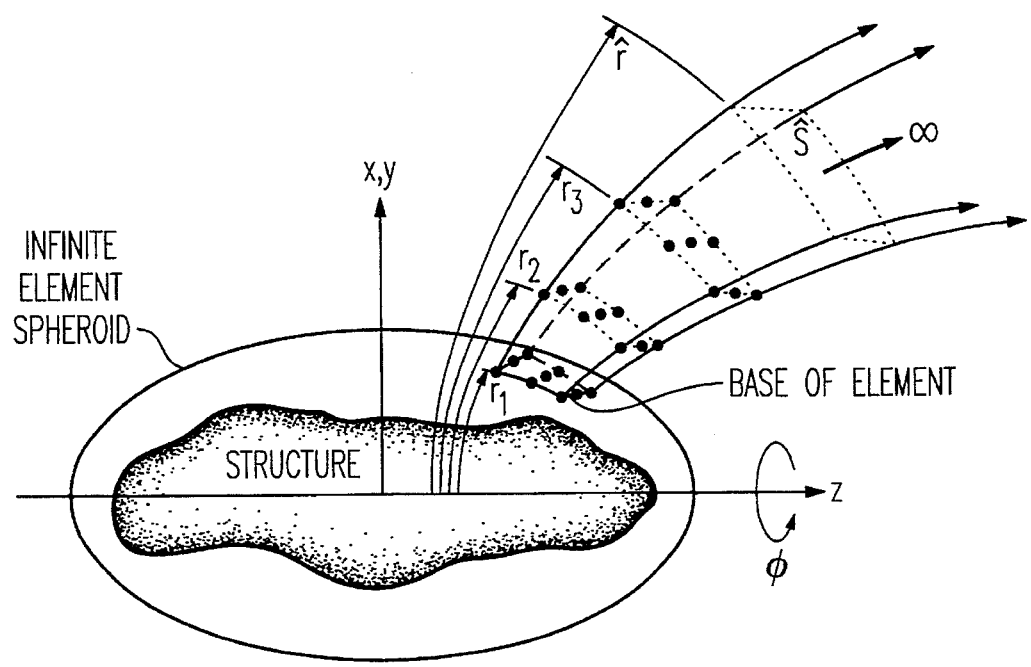
FIG. 7 depicts an illustrative prolate spheroidal infinite element.
Figure 8:
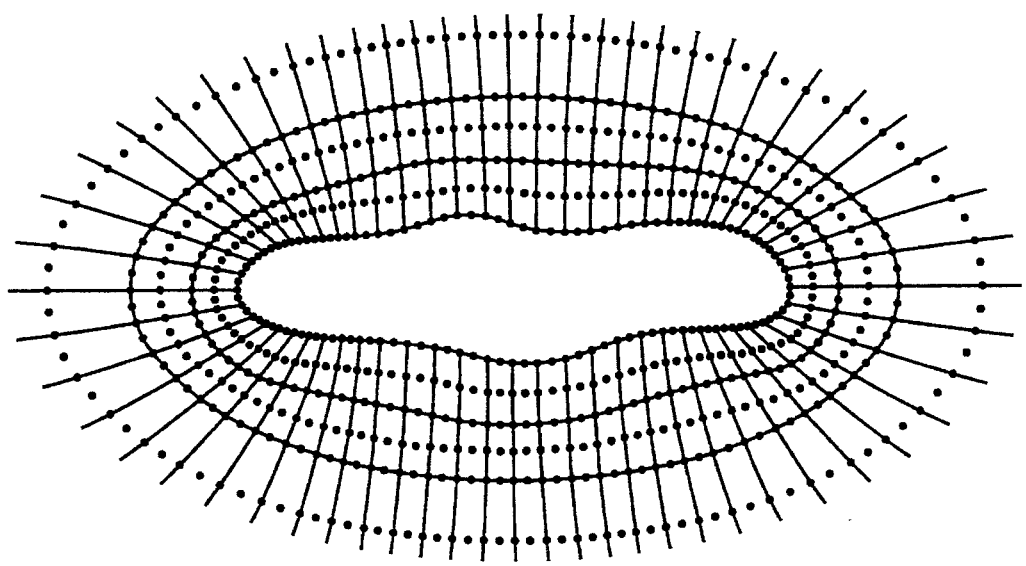
FIG. 8 depicts a typical mesh using infinite elements according to the invention.
Figure 9:
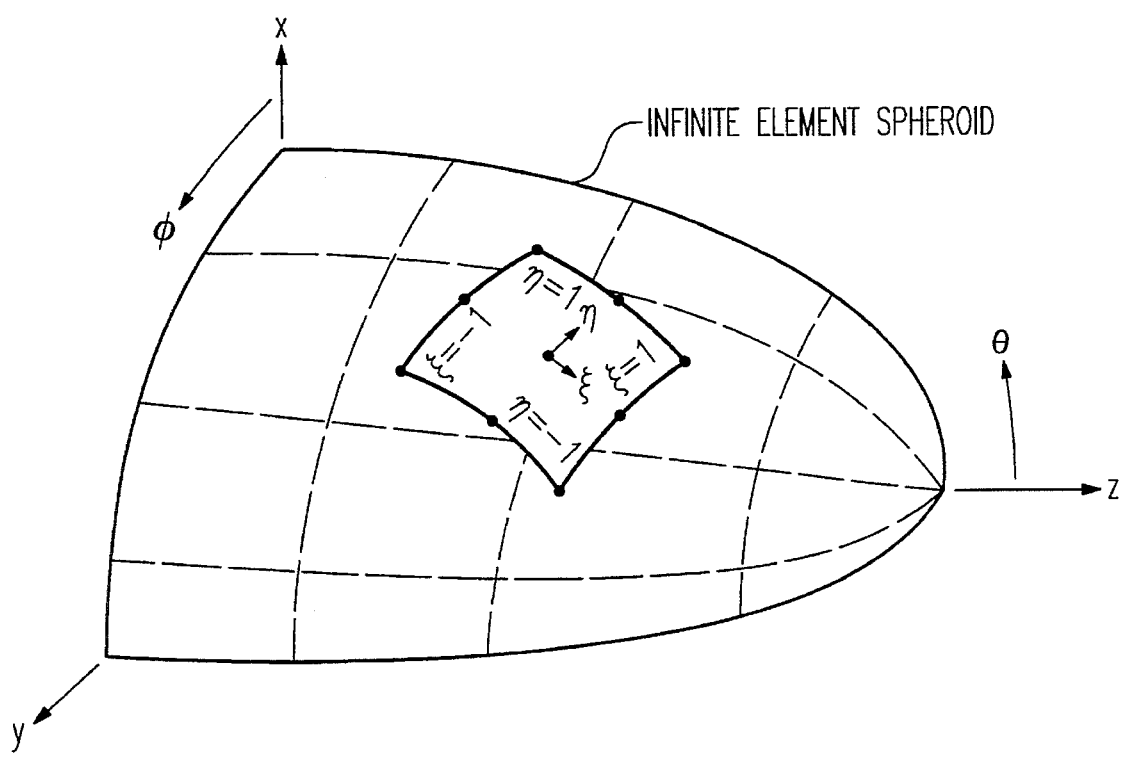
FIG. 9 shows the base of an illustrative infinite element, lying on the infinite element spheroid. The dashed lines in the figure are $\theta$, $\phi$-coordinate lines.

D. Geometry of a 3-D Variable Multipole Prolate Spheroidal Infinite Acoustic Element The infinite element is shown in FIG. 7, and a 2-D cross-section of a typical 3-D mesh outside an irregular, 3-D body is shown in FIG. 8. One face of the element, the "base", must attach to, and conform to the shape of, a prolate spheroidal surface of prolate radius $r_1$ surrounding the structure, called the "infinite element spheroid". The base may be a curvilinear quadrilateral (shown here) or triangle; it need not conform to the $\theta,\phi$ coordinate lines (FIG. 9). This permits one to construct a completely general 2-D mesh on the spheroid, comprising curvilinear quadilaterals and triangles of any shape and orientation. Any type of FE representation may be used over the base, e.g., Lagrange, serendipity or hierarchic polynomials of any degree. (The quadratic Lagrange nodal pattern shown here, and in later figures, is for illustrative purposes.)

The infinite element spheroid uniquely determines two loci, which in turn define a system of confocal spheroids and hyperboloids (cf. FIG. 4) that are used in the construction of the rest of the element. The side faces of the element are the loci of confocal hyperbolas emanating from the sides of the base. A multipole of order $$m\left(p = \left[\frac{a_1}{r} + \ldots + \frac{a_m}{r^m}\right] e^{-ikr}\right)$$

requires m layers of nodes that are on confocal spheroids of prolate radii $r_1, r_2, \ldots, r_m$. The nodal pattern is identical on each spheroid. The value m=2 corresponds to a dipole, m=3 to a quadrupole (as shown in FIG. 7), m=4 to an octupole, etc. A "variable-multipole" element contains a variable number of layers of nodes, permitting the analyst to refine the mesh radially in the infinite region by increasing the multipole order, m, analogous to p-extension for finite-size elements.

Finally, there is an outer spheroidal face, $\hat{S}$, at prolate radius $\hat{r}$, that recedes to infinity in the theoretical development. Thus, in deriving the element matrix equation, the element begins with a finite size, $r_1 \leq r \leq \hat{r}$, so that the Sommerfeld radiation condition can be applied to the outer face, and then the limit is taken as $\hat{r} \to \infty$.

Conventional $\xi,\eta$ coordinates (illustrated in FIG. 9 for a quadrilateral) are defined over the element cross-section, i.e., on spheroids, by the mapping $$\theta(\xi,\eta) = \sum_{v=1}^{n} \theta_v \chi_v^a(\xi,\eta), \quad \phi(\xi,\eta) = \sum_{v=1}^{n} \phi_v \chi_v^a(\xi,\eta), \quad (7)$$

where n is the number of nodes in the quadrilateral or triangle, $\theta_v, \phi_v$ are the prolate spheroidal angular coordinates of the $v^{th}$ node, and $\chi_v^a(\xi,\eta)$ are interpolation polynomials. (Alternatively, blending functions could be used if the elements are hierarchic.)

Since the base, intermediate nodal layers, and outer face conform to confocal spheroids and the side faces are the loci of confocal hyperbolas, the element is a right cylinder in $r,\theta,\phi$-space (or $r,\xi,\eta$-space) and the 3-D integrals separate into well-conditioned 2-D angular integrals and 1-D infinite integrals. An additional benefit is that the above mapping is limited to just the two finite angular dimensions, i.e., the $\theta,\phi$ coordinates, over spheroidal surfaces. The radial coordinate uses a separate mapping. This avoids the numerical ill-conditioning associated with 3-D mappings that mix together the infinite dimension with the two finite dimensions.

Figure 10:
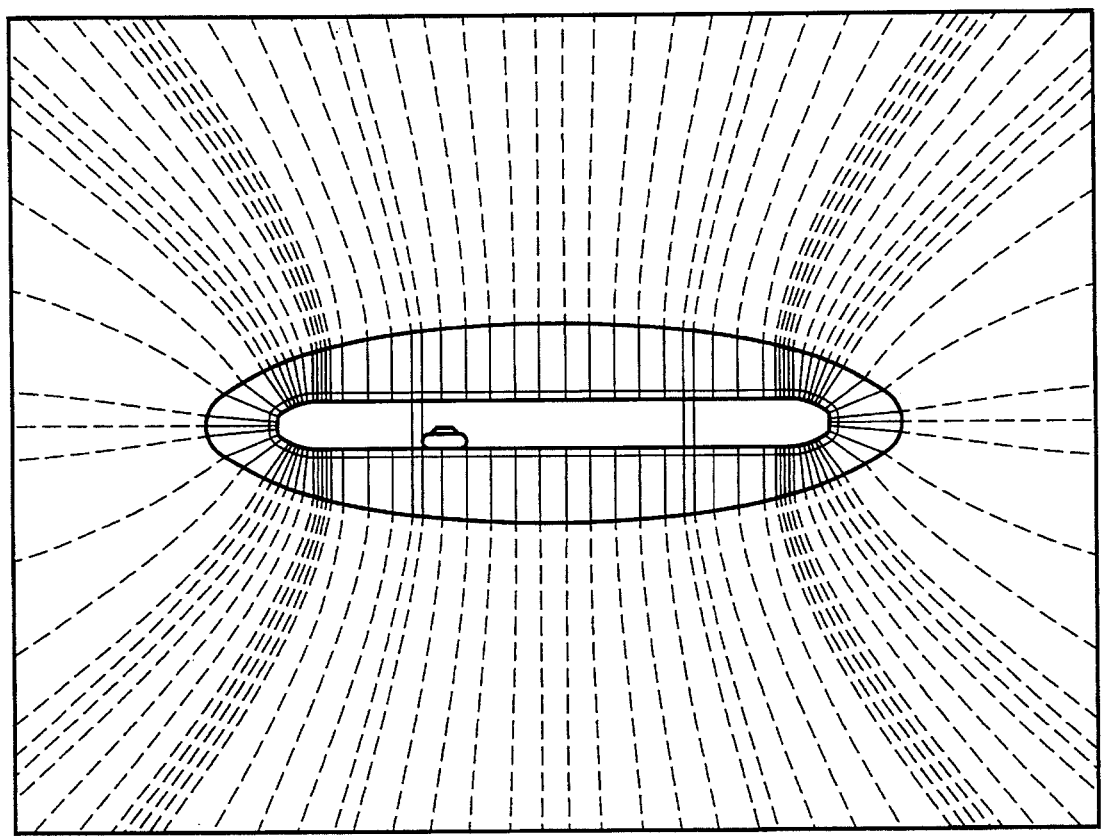
FIG. 10 is a 2D slice through a 3D mesh for a typical structural acoustics problem.

The use of these infinite elements is illustrated in FIG. 10, which shows a typical mesh for a structural acoustic problem. It is a cross-section of a 3-D mesh of the structure and the surrounding infinite fluid region. The structure is a circular cylindrical shell with rounded conical end caps and containing some internal structures. There are two layers of finite-size acoustic elements between the structure and the infinite element spheroid and then a layer of infinite elements, shown with dashed lines, outside the spheroid. The dashed lines are all hyperbolas. The first layer of finite-size elements is generated by projecting all the nodes on the shell's outer surface the same distance outward along normals to the shell, creating a surface parallel to the shell. The second layer projects the nodes on the parallel surface outward, along normals, to the spheroid. This is a simple procedure for automatic mesh generation for convex surfaces; concave surfaces would require a more sophisticated 3-D mesh generator.

Figure 11:
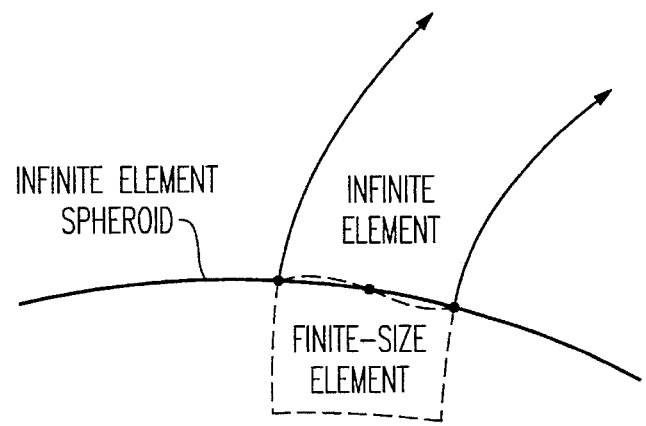
FIG. 11 shows the geometric discontinuity at an interface between adjacent infinite and finite-size elements.

There may or may not be a discontinuity (in $\xi,\eta$ coordinates and therefore in the dependent variable, pressure) between the infinite elements and adjacent finite-size elements along the infinite element spheroid (FIG. 11), depending on how the geometry for the finite-size elements is generated. If these finite-size elements use a conventional polynomial mapping based on the global Cartesian coordinates of the nodes, then the elements will not conform exactly to the shape of the spheroid. However, the mapping in Eq. (7) for the infinite element defines a set of $\xi,\eta$ coordinates that lie exactly on the spheroid. Thus there is a "sliver" of space, comprising gaps and overlaps, between the finite and infinite elements, and the $\xi,\eta$ coordinates in the two elements do not exactly coincide on their interface. This is not a problem because the error due to this geometric discontinuity converges to zero, as the mesh is h or p-refined, at the same rate as does the (well-known) error at the boundary of a curved domain when using conventional polynomial-mapped elements. Indeed, simple numerical calculations show that the maximum spatial separation between identical $\xi,\eta$ values on the faces of adjacent finite and infinite elements is typically several orders of magnitude less than internodal distances. (Using blending functions for the geometry of the finite-size elements would, of course, eliminate the discontinuity.)

E. Governing Physics Equations

Time-harmonic ($e^{i\omega t}$) behavior is governed by the 3-D Helmholtz equation, $$\nabla^2 p + k^2 p = 0 \quad (8)$$

where k is the wavenumber (=$\omega/c$), c is sound speed (= $\sqrt{B/\rho}$), B is bulk modulus, $\rho$ is density, and p is the complex-valued amplitude of scattered and/or radiated pressure:

$$p = \begin{cases} p^{scat} = p^{total} - p^{inc} & \text{if scattering} \\ p^{rad} = p^{total} & \text{if radiation} \\ p^{scat+rad} = p^{total} - p^{inc} & \text{if both} \end{cases} \quad (9)$$

To ensure uniqueness of the solution, the pressure must satisfy the Sommerfeld radiation condition at the outer "boundary" at infinity:

$$\frac{\partial p}{\partial r} + ikp = o\left(\frac{1}{r}\right), r \to \infty \quad (10)$$

where the lower case o, read "little o", means "faster than". The r in Eq. (10) is a spherical r. However, prolate spheroidal coordinates approach spherical coordinates as $r \to \infty$, so Eq. (10) can be used with prolate spheroidal coordinates in the limit as $r \to \infty$.

When Eq. (10) is applied to the outer face of the element $\hat{S}$, at prolate radius $\hat{r}$, as it recedes to infinity, Eq. (10) can be satisfied by the proper choice of shape functions.

F. Finite Element Representation of Pressure

1. General Expression; DOF Numbering

The scattered and/or radiated pressure is represented as follows, $$p(\xi,\eta,r) = \sum_{j=1}^{N} \psi_j(\xi,\eta,r) P_j \quad (11)$$

where $$\psi_j(\xi,\eta,r) = \psi_\nu^a(\xi,\eta)\psi_\mu^r(r) \quad (12)$$
$$\nu = 1,2,\ldots,n;$$
$$\mu = 1,2,\ldots,m$$
$$n \times m = N$$

Here $\psi_\nu^a(\xi,\eta)$ are "angular" shape functions that interpolate p over spheroidal surfaces confocal to the infinite element surface, and $\psi_\mu^r(r)$ are "radial" shape functions that interpolate p along hyperbolic rays. Interelement $C^0$-continuity is established by enforcing the interpolation property:

$$\psi_\nu^a(\xi_{\nu'},\eta_{\nu'}) = \delta_{\nu\nu'} \quad (13)$$

$$\psi_\mu^r(r_{\mu'}) = \delta_{\mu\mu'} \quad (14)$$

The currently preferred local node numbering convention is to begin with the nodes on the base of the element and then proceed radially outward, a layer of nodes at a time. This is summarized in Table I and illustrated in FIG. 12.

2. Angular Shape Functions

The functions $\psi_\nu^a(\xi,\eta)$ are conventional 2-D polynomials (serendipity, Lagrange or hierarchic).

Figure 12:
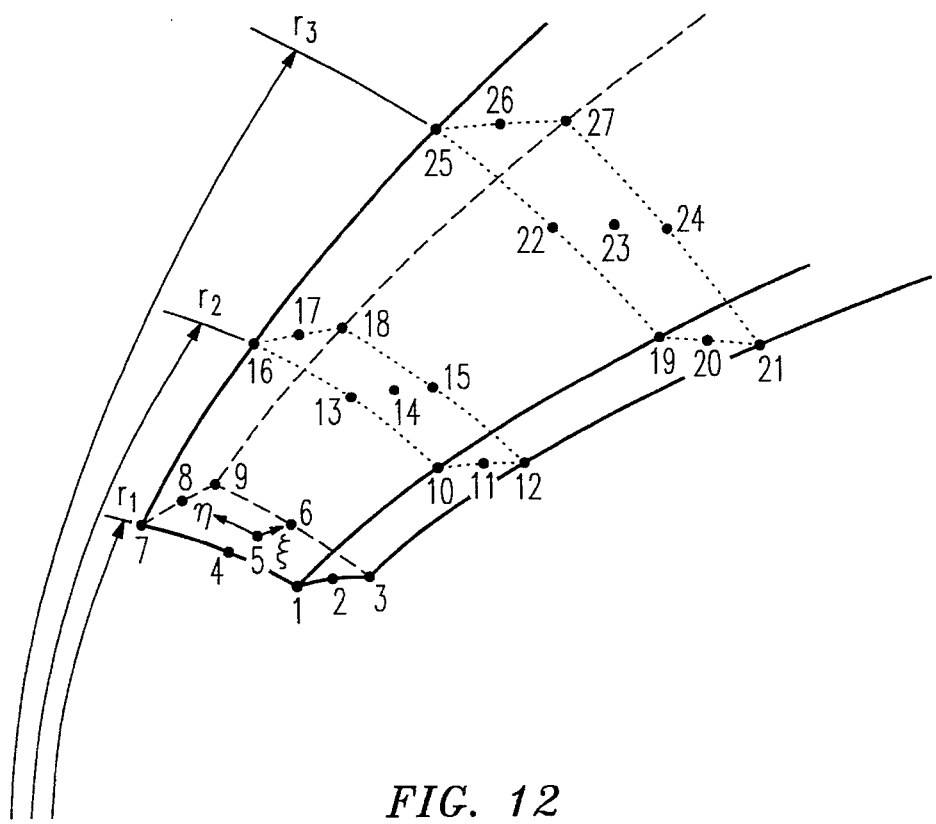
FIG. 12 illustrates a local node numbering convention for the particular case of a quadratic Lagrange quadrilateral (n=9) in the angular directions and a quadrupole (m=3) in the radial direction (N=m×n=27).

For example, for the quadratic Lagrange quadrilateral elements depicted in FIGS. 7, 9 and 12, the angular shape functions are $$\psi_\nu^a(\xi,\eta) = \tau_a(\xi)\tau_{a'}(\eta) \quad (15)$$
$$\nu = 1,2,\ldots,9$$
$$(a = 1,2,3; a' = 1,2,3)$$

where $$\tau_1(u) = \frac{1}{2} u(u-1); \tau_2(u) = 1 - u^2; \tau_3(u) = \frac{1}{2} u(u+1)$$

If the functions $\psi_\nu^a(\xi,\eta)$ are also used for the mapping functions $\chi_\nu^a(\xi,\eta)$ in Eq. (7), then the element is "isoparametric" in the angular directions.

3. Radial Shape Functions

The functions $\psi_\mu^r(r)$ use a truncated form of the radial part of the multipole expansion in Eq. (6), namely, an mth order multipole expansion:

$$\psi_\mu^r(r) = e^{-ik(r-r_\mu)} \sum_{\mu'=1}^{m} \frac{h_{\mu\mu'}}{(kr)^{\mu'}} \quad (16)$$

$$\mu = 1,2,\ldots,m (m \geq 2)$$

The phase factor $e^{ikr_\mu}$ does not need to be included; if omitted, it will simply appear in each $h_{\mu\mu'}$ in Eq. (20) below. The factors $k^{\mu'}$ in the denominators are also not necessary; they are included only to make the $h_{\mu\mu'}$ nondimensional.

The coefficients $h_{\mu\mu'}$ are determined by the requirement of interelement $C^0$-continuity. Applying Eq. (14) to Eq. (16) yields m sets of m linear algebraic equations:

$$[H][S] = [I] \quad (17)$$

where $$H_{\mu\mu'} = h_{\mu\mu'}, \quad (18)$$

$$S_{\mu\mu'} = (kr_\mu)^{-\mu'}, \quad (19)$$

and [I] is the identity matrix. Therefore, $$[H] = [S]^{-1} \quad (20)$$

This procedure defines m layers of nodes (with n nodes on each layer) lying on spheroids of prolate radii $r_1, r_2, \ldots, r_m$ (cf. FIG. 12).

To illustrate, consider a dipole element (m=2), $$\psi_\mu^r(r) = e^{-ik(r-r_\mu)} \left[\frac{h_{\mu 1}}{kr} + \frac{h_{\mu 2}}{(kr)^2}\right] \quad (21)$$

$$\mu = 1,2$$

Inverting a 2×2 [S] matrix yields $$[H] = \begin{bmatrix} h_{11} & h_{12} \\ h_{21} & h_{22} \end{bmatrix} = \frac{1}{r_2 - r_1} \begin{bmatrix} -kr_1^2 & k^2 r_1^2 r_2 \\ -kr_2^2 & -k^2 r_1 r_2^2 \end{bmatrix} \quad (22)$$

The procedure in Eqs. (16)–(20) is the one that has been used to date. However, a hierarchic formulation would have the usual advantages of ease of mesh refinement (by p-extension), improved numerical conditioning and elimination of all nodes exterior to the infinite element spheroid. The last advantage is especially important because it would eliminate the need to locate nodes on hyperbolic trajectories, which is not a standard technique in FE mesh generators. To convert to a hierarchic formulation, the angular directions would employ the standard 2-D hierarchic shape functions for quadrilaterals and triangles. The radial direction would use the mapping $\zeta = 1 - 2r_1/r$, which linearly maps the interval $1/r \in [1/r_1, 0)$ to the interval $\zeta \in [-1,1)$, and then employ the standard 1-D hierarchic shape functions in $\zeta$, excluding the linear function that is unity at infinity, i.e., at $\zeta = 1$.

4. Stiffness, Mass, and Radiation Damping Matrices, and the Element Matrix Equation Further mathematical details of the derivation of these expressions may be found in the Appendix attached hereinbelow as well as in the article by D. S. Burnett, "A 3-D Acoustic Infinite Element Based on a Prolate Spheroidal Multipole Expansion," *J. Acoust. Soc. Am.* 96 (4), October, 1994, which is hereby incorporated by reference.

1. Formal Expressions

The matrices for the element matrix equation are derived by starting with a finite-size element, i.e., with the outer face on a spheroid of prolate radius $\hat{r}$ (cf. FIG. 7), and then taking the limit as $\hat{r} \to \infty$. Thus, applying the Galerkin-weighted residual method to Eq. (8) over a single element yields $$\lim_{\hat{r} \to \infty} \iiint (b\nabla^2 p + \omega^2 \rho p)\psi_i dV = 0, \qquad (23)$$

$$i = 1, 2, \ldots, N,$$

using $k^2 = \omega^2 \rho/B$. The first integral is converted into a surface integral and another volume integral using the identity $\psi_i \nabla^2 p = \nabla \cdot (\psi_i \nabla p) - \nabla \psi_i \cdot \nabla p$ and the divergence theorem. Substituting Eq. (11) into the volume integrals yields the following element matrix equation:

$$([K] - \omega^2 [M])\{P\} = \{F\}, \qquad (24)$$

where the stiffness matrix [K], mass matrix [M], and pressure gradient vector $\{F\}$ are, respectively, $$K_{ij} = \lim_{\hat{r} \to \infty} \int_{V^{(e)}} \int \int B \nabla \psi_i \cdot \nabla \psi_j dV, \qquad (25)$$

$$M_{ij} = \lim_{\hat{r} \to \infty} \int_{V^{(e)}} \int \int \rho \psi_i \psi_j dV,$$

$$F_i = \lim_{\hat{r} \to \infty} \oint_{S^{(e)}} B \psi_i \frac{\partial p}{\partial n} dS.$$

The surface integral for $\{F\}$ is over the entire boundary of the element, $S^{(e)}$. It is split into two integrals: one over the outer face $\hat{S}^{(e)}$ and the other over the remaining faces $S^{(e)} - \hat{S}^{(e)}$, $$F_i = \lim_{\hat{r} \to \infty} \int_{\hat{S}^{(e)}} \int B \psi_i \frac{\partial p}{\partial n} dS + \qquad (26)$$

$$\lim_{\hat{r} \to \infty} \int \int_{S^{(e)} - \hat{S}^{(e)}} B \psi_i \frac{\partial p}{\partial n} dS.$$

Consider the first integral in Eq. (26). As $\hat{r} \to \infty$, prolate spheroidal coordinates approach spherical coordinates so $\partial p/\partial n \to \partial p/\partial r$ and $dS \to r^2 \sin \theta d\theta d\phi$, where $r, \theta, \phi$ are spherical coordinates. To evaluate $\partial p/\partial r$ as $\hat{r} \to \infty$, substitute Eqs. (11), (12), and (16) into Eq. (10), which yields a stronger form of the Sommerfeld condition, $$\frac{\partial p}{\partial r} + ikp = O\left[\frac{1}{r^2}\right], r \to \infty, \qquad (27)$$

where the upper-case O, read "big oh," means "at least as fast as." Substitute $\partial p/\partial r$ in Eq. (27) for $\partial p/\partial n$ in the first integral. The $O(1/r^2)$ term makes no contribution to the integral because $\psi_i$ is $O(1/r)$ and $dS \propto r^2$ as $\hat{r} \to \infty$. In the remaining term $ikp$, substitute Eq. (11) for p.

In the second integral in Eq. (26), substitute the balance of linear momentum for $\partial p/\partial n$, viz., $\partial p/\partial n = \omega^2 \rho u_n$, where $u_n$ is the amplitude of the normal component of particle displacement.

Making these substitutions, Eq. (26) becomes $$\{F\} = -i\omega[C]\{P\} + \{D\}, \qquad (28)$$

where $$C_{ij} = \rho c \lim_{\hat{r} \to \infty} \int_{\hat{S}^{(e)}} \int \psi_i \psi_j dS, \qquad (29)$$

$$D_i = (\omega \rho c)^2 \lim_{\hat{r} \to \infty} \int \int_{S^{(e)} - \hat{S}^{(e)}} \psi_i u_n dS.$$

The [C] matrix is the radiation damping matrix, representing radiation loss to infinity. The $\{D\}$ vector permits specification of $u_n$ on the side or bottom faces of the element.

Substituting Eq. (28) into Eq. (24) yields, for the element matrix equation, $$([K] + i\omega[C] - \omega^2[M])\{P\} = \{D\}, \qquad (30)$$

where, summarizing, the formal expressions for the stiffness, mass, and radiation damping matrices are, respectively, $$K_{ij} = \lim_{\hat{r} \to \infty} \int \int_{V^{(e)}} \int B \nabla \psi_i \cdot \nabla \psi_j dV, \qquad (31)$$

$$M_{ij} = \lim_{\hat{r} \to \infty} \int \int_{V^{(e)}} \int \rho \psi_i \psi_j dV,$$

$$C_{ij} = \rho c \lim_{\hat{r} \to \infty} \int \int_{\hat{S}^{(e)}} \psi_i \psi_j dS.$$

The $D_i$ are zero in virtually all practical applications.

2. Transformation of Integrals; Final Expressions

The remaining mathematics transform the integrals in Eq. (31) to expressions that can be numerically evaluated. (The $D_i$ integrals are ignored because they are zero in virtually all practical applications.) Mathematical details may be found in the Appendix; following is a brief description of the principal steps.

Transform the Integrals in Eq. (31) to Prolate Spheroidal Coordinates $r, \theta, \phi$.

The differential volume and surface elements are $dV = J_v dr d\theta d\phi$ and $dS = J_s d\theta d\phi$, where $J_v$ is the volume Jacobian and $J_s$ is the surface Jacobian. $J_v$ and $J_s$, as well as the gradient operator, $\nabla$, in $K_{ij}$ in Eq. (31), are expressed in prolate spheroidal coordinates. This separates the 3-D integrals for $K_{ij}$ and $M_{ij}$ into products of 2-D "angular" integrals over $\theta, \phi$ and 1-D "radial" integrals over r, and the 2-D integral for $C_{ij}$ into the product of a 2-D angular integral and a function of r.

Develop Final Expressions for the Angular Integrals

Transform the $\theta, \phi$ coordinates to local $\xi, \eta$ coordinates using the coordinate mapping in Eq. (7) [cf. FIG. 9]. The resulting well-defined integrals can be numerically integrated using Gauss rules in the conventional FE manner.

Develop Final Expressions for the Radial Integrals for $K_{ij}$ and $M_{ij}$ and Radial Function for $C_{ij}$ Substitute Eq. (16) into each of the radial integrals and radial function and perform various algebraic operations. Some of the integrals become well-defined Fourier sine or cosine transforms, which can be evaluated by standard algorithms available in many mathematics software packages. The other integrals, as well as the radial function, result in undefined oscillatory terms, which are treated in the next step.

Form Final Expression for Element Matrix Equation

All the above expressions, including both the well-defined integrals and the undefined oscillatory terms, are substituted into Eq. (30), the element matrix equation. The parenthetical expression for the three matrices becomes, $$[K] + i\omega[C] - \omega^2[M] = [K^\infty] - \omega^2[M^\infty] + \text{undefined oscillatory terms} \quad (32)$$

where $[K^\infty]$ and $[M^\infty]$ comprise all the well-defined integrals. The undefined oscillatory terms all cancel, leaving as the final form of the element matrix equation, $$[[K^\infty] - \omega^2[M^\infty]]\{P\} = \{D\} \quad (33)$$

where the expressions for $K_{ij}^\infty$ and $M_{ij}^\infty$ are as follows ($D_i$ are zero in virtually all practical applications):

$$K_{ij}^\infty = B(A_{\nu'\nu}^{(1)} R_{\mu'\mu}^{(1)} + A_{\nu'\nu}^{(2)} R_{\mu'\mu}^{(2)} - \epsilon_1^2 A_{\nu'\nu}^{(1)} R_{\mu'\mu}^{(3)} + \epsilon_1^2 A_{\nu'\nu}^{(3)} R_{\mu'\mu}^{(4)}) \quad (34)$$
$$M_{ij}^\infty = \rho r_1^2 (A_{\nu'\nu}^{(1)} R_{\mu'\mu}^{(5)} - \epsilon_1^2 A_{\nu'\nu}^{(4)} R_{\mu'\mu}^{(2)})$$

where B is bulk modulus, $\rho$ is density, $r_1$ is the prolate radius of the infinite element spheroid, and $\epsilon_1$ (=$f/r_1$) is the eccentricity of the infinite element spheroid.

The angular integrals, $A_{\nu'\nu}^{(i)}$, $i=1,\ldots,4$, $\nu',\nu=1,\ldots,n$ (cf. Table I), are $$A_{\nu'\nu}^{(1)} = \int_{\sigma^{(e)}} \int \psi_{\nu'}^a \psi_\nu^a \sin\theta J d\xi d\eta \quad (35)$$

$$A_{\nu'\nu}^{(2)} = \int_{\sigma^{(e)}} \int \left( \frac{\partial \psi_{\nu'}^a}{\partial \theta} \frac{\partial \psi_\nu^a}{\partial \theta} \sin\theta + \frac{\partial \psi_{\nu'}^a}{\partial \phi} \frac{\partial \psi_\nu^a}{\partial \phi} \frac{1}{\sin\theta} \right) J d\xi d\eta$$

$$A_{\nu'\nu}^{(3)} = \int_{\sigma^{(e)}} \int \frac{\partial \psi_{\nu'}^a}{\partial \phi} \frac{\partial \psi_\nu^a}{\partial \phi} \sin\theta J d\xi d\eta$$

$$A_{\nu'\nu}^{(4)} = \int_{\sigma^{(e)}} \int \psi_{\nu'}^a \psi_\nu^a \cos^2\theta \sin\theta J d\xi d\eta$$

where $$\int_{\sigma^{(e)}} \int \ldots d\xi d\eta = \begin{cases} \int_{-1}^{1} \int_{-1}^{1} \ldots d\xi d\eta \text{ for quadrilaterals} \\ \int_0^1 \int_0^{1-\eta} \ldots d\xi d\eta \text{ for triangles} \end{cases} \quad (36)$$

All four integrals in Eq. (35) can be numerically integrated using standard Gauss rules since the integrands are smooth and bounded (including the $1/\sin\theta$ term because $J \propto \theta$ as $\theta \to 0$).

The Jacobian, J, is computed from the coordinate mapping in Eq. (7), $$J = \begin{vmatrix} \frac{\partial \theta}{\partial \xi} & \frac{\partial \phi}{\partial \xi} \\ \frac{\partial \theta}{\partial \eta} & \frac{\partial \phi}{\partial \eta} \end{vmatrix} \quad (37)$$

and the derivatives of $\psi_\nu^a$ are evaluated in the conventional finite-element manner, $$\left\{ \begin{array}{c} \frac{\partial \psi_\nu^a}{\partial \theta} \\ \frac{\partial \psi_\nu^a}{\partial \phi} \end{array} \right\} = [J]^{-1} \left\{ \begin{array}{c} \frac{\partial \psi_\nu^a}{\partial \xi} \\ \frac{\partial \psi_\nu^a}{\partial \eta} \end{array} \right\} \quad (38)$$

The angle $\theta$, for the functions $\sin\theta$ and $\cos\theta$, is also computed from Eq. (7).

The radial integrals, $R_{\mu'\mu}^{(i)}$, $i=1,\ldots,5$, $\mu',\mu=1,\ldots,m$ (cf. Table I), are $$R_{\mu'\mu}^{(1)} = L_{\mu'\mu} \left[ -\frac{i}{2} b_2 e^{-i2\zeta} + \sum_{\beta=1}^{2m} b_{\beta+2} I_\beta \right] \quad (39)$$

$$R_{\mu'\mu}^{(2)} = L_{\mu'\mu} \sum_{\beta=2}^{2m} c_\beta I_\beta$$

$$R_{\mu'\mu}^{(3)} = L_{\mu'\mu} \zeta^2 \sum_{\beta=2}^{2m+2} b_\beta I_\beta$$

$$R_{\mu'\mu}^{(4)} = L_{\mu'\mu} \zeta^2 \sum_{\beta=2}^{2m} c_\beta J_\beta$$

$$R_{\mu'\mu}^{(5)} = L_{\mu'\mu} \frac{1}{\zeta^2} \left[ -\frac{i}{2} c_2 e^{-i2\zeta} + \sum_{\beta=1}^{2m-2} c_{\beta+2} I_\beta \right]$$

where $$L_{\mu'\mu} = (1/k) e^{ik(r_{\mu'} + r_\mu)} \quad (40)$$
$$\zeta = kr_1 \quad (41)$$

$$I_\beta = \int_{r_1}^{\infty} \frac{e^{-i2kr}}{(kr)^\beta} k dr \quad \beta \geq 1 \quad (42)$$

$$= e^{-i2\zeta} \left[ \int_0^\infty \frac{\cos 2x}{(x+\zeta)^\beta} dx - i \int_0^\infty \frac{\sin 2x}{(x+\zeta)^\beta} dx \right]$$

which are Fourier sine and cosine transforms that can be evaluated by standard algorithms available in many mathematics software packages, $$J_\beta = \int_{r_1}^\infty \frac{e^{-i2kr}}{[(kr)^2 - \epsilon_1^2 \zeta^2](kr)^\beta} k dr \quad \beta \geq 2 \quad (43)$$

$$= e^{-i2\zeta} \left[ \int_0^\infty \frac{\cos 2x}{[(x+\zeta)^2 - \epsilon_1^2 \zeta^2](x+\zeta)^\beta} dx - i \int_0^\infty \frac{\sin 2x}{[(x+\zeta)^2 - \epsilon_1^2 \zeta^2](x+\zeta)^\beta} dx \right]$$

which can be evaluated with the same software used for $I_\beta$, $$a_{\mu\alpha} = -ih_{\mu\alpha} - (\alpha - 1)h_{\mu,\alpha-1} \quad (44)$$
$$\mu = 1, 2, \ldots, m$$
$$\alpha = 1, 2, \ldots, m+1$$
and
$$h_{\mu 0} = h_{\mu,m+1} = 0.$$

$$b_\beta = \sum_{\gamma=1}^{\beta-1} a_{\mu\gamma} a_{\mu,\beta-\gamma} \quad (45)$$

and, from Eq. (44), $a_{\mu\alpha} = 0$ for $\alpha > m+1$.

$$c_\beta = \sum_{\gamma=1}^{\beta-1} h_{\mu\gamma} h_{\mu,\beta-\gamma} \quad (46)$$

and $h_{\mu\alpha}$ are determined by Eq. (20).

The tensor products $A_{\nu'\nu} R_{\mu'\mu}$ in Eq. (34) are N×N matrices that are constructed by multiplying each term in the m×m [R] matrix by the entire n×n [A] matrix, as shown in Eq. (47). Above and to the left of the matrix are tables, reproduced from Table I, showing the relationship of the indices μ and ν to j, and μ' and ν' to i:

$$\begin{array}{c|cccc} j & 1\,2\ldots & \ldots & \ldots & \ldots N \\ \hline \mu & 1 & 2 & \ldots & m \\ \nu & 1\,2\ldots n & 1\,2\ldots n & \ldots & 1\,2\ldots n \end{array} \qquad (47)$$

$$\begin{array}{cc|c} i & \mu' & \nu' \\ \hline 1 & & 1 \\ 2 & & 2 \\ \vdots & 1 & \vdots \\ & & n \\ \hline \vdots & & 1 \\ & & 2 \\ \vdots & 2 & \vdots \\ & & n \\ \hline \vdots & \vdots & \vdots \\ \hline & & 1 \\ & & 2 \\ \vdots & m & \vdots \\ N & & n \end{array} \begin{bmatrix} R_{11}[A] & R_{12}[A] & \ldots & R_{1m}[A] \\ & R_{22}[A] & \ldots & R_{2m}[A] \\ & & \ddots & \vdots \\ \text{symmetric} & & & R_{mm}[A] \end{bmatrix}$$

Eq. (33), which is the element matrix equation, and its supporting Eqs. (34)–(47) are the equations cited in box 20 of FIG. 1. These equations are sufficient to implement this invention. They may be coded into any scientific programming language; FORTRAN is currently the most popular choice.

Some practical observations in implementing the above equations into software are as follows. The radial integrals in Eq. (39) are identical for every infinite element in a mesh (because they are independent of angular variables and are along identical prolate radial paths, i.e., confocal hyperbolas emanating from the same spheroid), so they only need to be evaluated once for a given problem; their computational cost is totally insignificant. Hence, the numerical integration required to generate $[K^\infty]$ and $[M^\infty]$ for each infinite element involves only the evaluation of the 2-D angular integrals, making these 3-D elements as cheap to generate as 2-D elements. In addition, since the frequency dependence of the element is contained only in the radial integrals, element generation during a frequency sweep is essentially free after the first frequency.

EXAMPLE

To demonstrate the power of the inventive method, we calculated a structural acoustics problem using both the exemplary IEM code and, for comparison, a conventional Boundary Element Method (BEM) code. The structure was a long (aspect ratio of 10), cylindrical, thin, steel shell with tapered end caps and no internal structure, surrounded by water. The shell was excited by an obliquely incident plane wave at ka=1. (The symbol a represents the radius of the cylindrical shell.)

Figure 13:
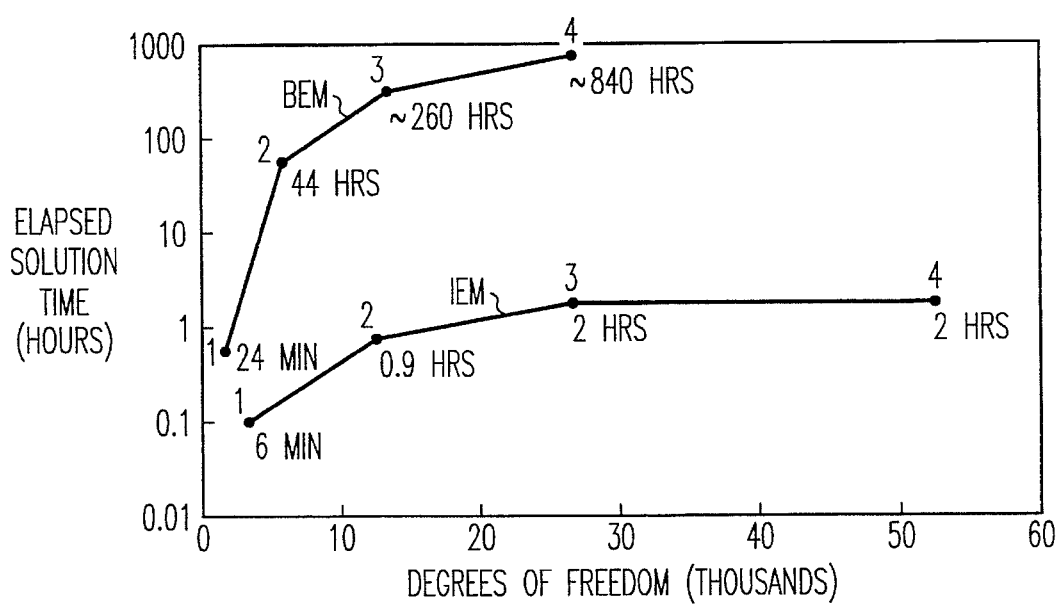
FIG. 13 compares the performance of a BEM code to that of the exemplary IEM code for four different meshes for a structural acoustic problem. The IEM fluid mesh, which is topologically identical in the radial direction for all four meshes, was adjusted to yield approximately the same rms error as the BEM on the surface of the structure.

FIG. 13 shows the total elapsed solution time for a sequence of four progressively refined meshes for each of the two comparative methods. The solution time represents matrix generation plus equation solving, but does not include exterior field evaluation.

Since this system has three orthogonal planes of symmetry, it was sufficient for meshes 1, 2, and 3 to model a single octant. Consequently, it was possible to treat the obliquely incident wave by performing four analyses of the octant, each analysis having different symmetric or antisymmetric boundary conditions on the symmetry planes, and then superposing the results of the analyses.

Mesh 4 doubled mesh 3, thus covering a quadrant of the structure. This would be needed for a structure having only two planes of symmetry. This had the effect of roughly tripling the BEM cost, but it did not increase the IEM cost. The number of degrees of freedom (DOF) per analysis doubled for both methods while the number of analyses was halved. However, the rms half bandwidth $B_{rms}$, which almost doubled for the BEM, remained almost constant for the IEM.

The times reported in FIG. 13 are for the maximum possible number of symmetric and antisymmetric analyses for the most general asymmetric excitation, i.e., 8×the run time for one-octant analysis, and 4×the run time for one-quadrant analysis. Run times for meshes 3 and 4 for the BEM are estimated times; estimates of times for meshes in a refinement sequence have consistently been accurate to within a few percent.

It is evident from the figure that the BEM is not substantially more expensive than the IEM for problems having less than a few thousand DOF. However, the IEM rapidly becomes more economical as the problems grow larger.

It should be noted that in order to practice the IEM, it is necessary to generate a 3-D mesh in the fluid surrounding the structure. This is a relatively simple matter for structures with convex outer surfaces. For example, the exemplary code typically requires only two or three commands to generate the entire fluid mesh for a structure having such a surface. We simply project outward the 2-D mesh that is on the fluid-contacting surface of the structure. For more general structural geometries, 3-D meshes can be generated by a wide variety of commercially available mesh generation programs.

We have tested the accuracy of the IEM against theoretical analyses and other structural acoustics programs such as our BEM program (which uses the same structural code as our IEM program). We have run a wide variety of scattering and radiation problems on both the IEM and BEM codes, and have achieved very close agreement in all cases. In the comparative IEM runs, we terminated the mesh refinements in the fluid when pointwise differences in acoustic pressure and structural velocity (relative to the BEM) were, typically, about 1%. We refer to this level of agreement as "graphical accuracy." For more rigorous studies, we terminated when the rms difference of all nodal values of pressure and normal velocity on the fluid-contacting surface of the structure was, typically, between 0.1% and 1%.

For the problem of thin cylindrical shells described above, the following fluid meshes provided errors of 0.1%–1%: For scattering problems, two layers of fluid elements, quadratic in the radial direction, surround the structure, as depicted in FIG. 10. The outer surface of the first layer is parallel to the structural surface and lies at a distance of $3\lambda/32$, where $\lambda$ is the characteristic wavelength in the fluid at the excitation frequency $\omega$. The outer surface of the second layer is the infinite element spheroid, and it is separated from the inner parallel surface by $13\lambda/32$ on both the semi-major and semi-minor axes. Hence, the infinite element spheroid is, on average, $\lambda/2$ from the structure. The infinite elements use only a dipole, with $r_2=2r_1$. (The significance of the distances $r_1$, $r_2$, etc. is readily understood by reference to FIG. 7.)

Of course, quadrupoles, using $r_3=3r_1$, and octupoles, using $r_4=4r_1$, may be expected to yield greater accuracy than dipoles. In general, the accuracy of the infinite element appears to be independent of the radial location of the layers of multipole nodes. In this regard, we found that model problems were insensitive, to at least five significant figures, to a wide range of values of $r_1, r_2, \ldots, r_m$.

Figure 14:
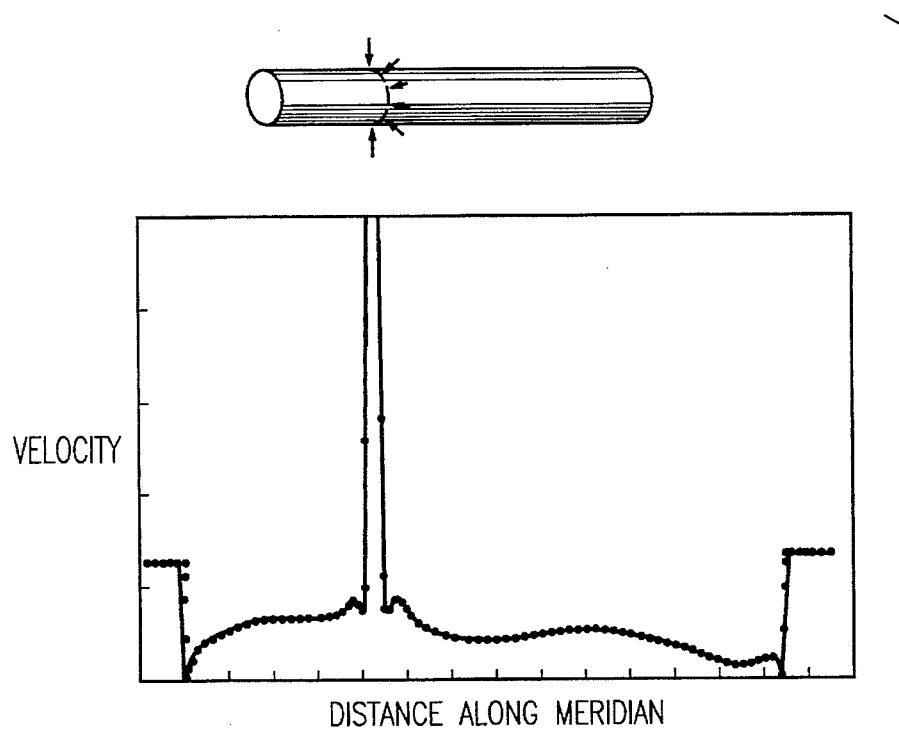
FIG. 14 is a graph of the normal velocity along the meridian of a cylindrical thin shell with rigid, flat, end caps. The cylinder has an aspect ratio of 6.7:1, and is excited by a ring force. The product ka is equal to 1. The solid curve represents the analytical solution, and the discrete points represent the infinite element calculation.
Figure 15:
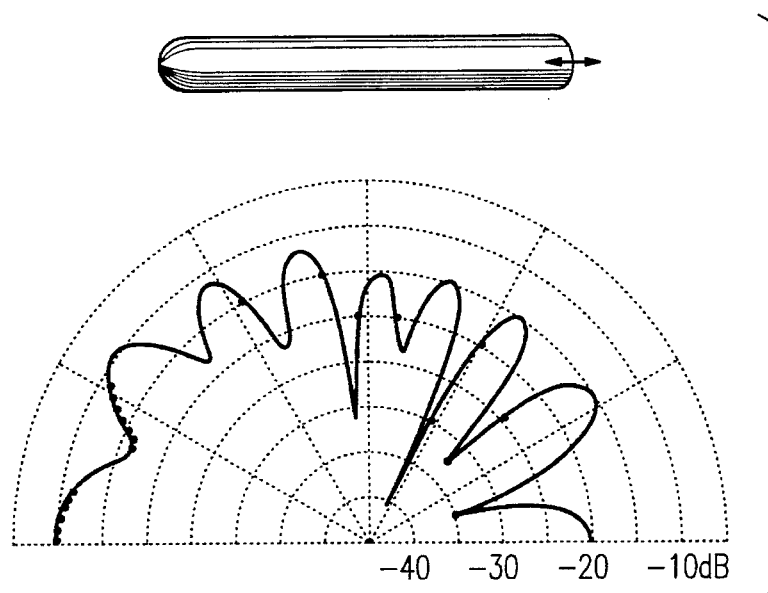
FIG. 15 is a graph of the far-field radiation pattern of a cylindrical thin shell having elastic, hemispherical end caps. The cylinder has an aspect ratio of 6:1, and is excited by an axial point force. The product ka is equal to 1.9. As in FIG. 14, the solid curve represents the analytical solution, and the discrete points represent the infinite element calculation.

The meshes used for scattering problems can also be used to solve radiation problems excited by point or line forces on the shell, as depicted, for example, in FIGS. 14 and 15. However, this class of radiation problems calls for somewhat greater radial refinement within the infinite element spheroid near the places where the force is applied. We found that this requirement is satisfied, and an even smaller error is everywhere obtained, by replacing the two layers of radially quadratic elements by a single layer of radially quartic elements. (Both meshes use the same number of DOF.) Our practical experience suggests that the most efficient fluid mesh for this class of radiation problems, in the 0.1%–1% error range, is a single layer of radially cubic elements, with quartics near point or line forces, combined with dipole infinite elements.

TABLE I

Node Numbering Pattern Relating Nodal (DOF) Index j
To Radial Index μ And Angular Index ν, N = m × n

| | j | μ | ν |
|---|---|---|---|
| on spheroidal surface at $r_1$ (base of infinite element) | 1 | 1 | 1 |
| | 2 | 1 | 2 |
| | . | . | . |
| | . | . | . |
| | . | . | . |
| | n | 1 | n |
| on spheroidal surface at $r_2$ | n + 1 | 2 | 1 |
| | n + 2 | 2 | 2 |
| | . | . | . |
| | . | . | . |
| | . | . | . |
| | 2n | 2 | n |
| . | . | . | . |
| . | . | . | . |
| . | . | . | . |
| on spheroidal surface at $r_m$ | (m − 1) n + 1 | m | 1 |
| | (m − 1) n + 2 | m | 2 |
| | . | . | . |
| | . | . | . |
| | . | . | . |
| | N | m | n |

APPENDIX

1. Formal Expressions

The element matrices are derived by starting with a finite-size element, i.e., with the outer face on a spheroid of prolate radius $\hat{r}$, and then taking the limit as $\hat{r} \to \infty$. Thus, applying the Galerkin weighted residual method to Eq. (8) over a single element yields $$\lim_{\hat{r}\to\infty} \iiint (B\nabla^2 p + \omega^2 \rho p)\psi_i dV = 0 \qquad (23A)$$
$$i = 1, 2, \ldots, N$$

using $k^2 = \omega^2 \rho / B$. The first integral is converted into a surface integral and another volume integral using the identity $\psi_i \nabla^2 p = \nabla \cdot (\psi_i \nabla p) - \nabla \psi_i \cdot \nabla p$ and the divergence theorem. Substituting Eq. (11A) into the volume integrals yields the following element matrix equation:

$$([K] - \omega^2[M])\{P\} = \{F\} \qquad (24A)$$

where the stiffness matrix, [K], mass matrix, [M], and pressure gradient vector, {F}, are, respectively, $$K_{ij} = \lim_{\hat{r}\to\infty} \int_{V^{(e)}} \int\int B\nabla\psi_i \cdot \nabla\psi_j dV \qquad (25A)$$

$$M_{ij} = \lim_{\hat{r}\to\infty} \int_{V^{(e)}} \int\int \rho\psi_i\psi_j dV$$

$$F_i = \lim_{\hat{r}\to\infty} \oint_{S^{(e)}} B\psi_i \frac{\partial p}{\partial n} dS$$

The surface integral for {F} is over the entire boundary of the element, $S^{(e)}$. It is split into two integrals: one over the outer face, $\hat{S}^{(e)}$, and the other over the remaining faces, $S^{(e)} - \hat{S}^{(e)}$, $$F_i = \lim_{\hat{r}\to\infty} \int_{\hat{S}^{(e)}} \int B\psi_i \frac{\partial p}{\partial n} dS + \lim_{\hat{r}\to\infty} \int\int_{S^{(e)} - \hat{S}^{(e)}} B\psi_i \frac{\partial p}{\partial n} dS \qquad (26A)$$

Consider the first integral in Eq. (26A). As $\hat{r} \to \infty$, prolate spheroidal coordinates approach spherical coordinates so $\partial p/\partial n \to \partial p/\partial r$ and $dS \to r^2 \sin\theta d\theta d\phi$, where $r, \theta, \phi$ are spherical coordinates. To evaluate $\partial p/\partial r$ as $\hat{r} \to \infty$, substitute Eqs. (11A), (12A) and (16A) into Eq. (10A), which yields a stronger form of the Sommerfeld condition, $$\frac{\partial p}{\partial r} + ikp = O\left(\frac{1}{r^2}\right), r\to\infty \qquad (27A)$$

where the upper case o, read "big o", means "at least as fast as". Substitute $\partial p/\partial r$ in Eq. (27A) for $\partial p/\partial n$ in the first integral. The $O(1/r^2)$ term makes no contribution to the integral because $\psi_i$ is $O(1/r)$ and $dS \propto r^2$ as $\hat{r} \to \infty$. In the remaining term, ikp, substitute Eq. (11A) for p.

In the second integral in Eq. (26A), substitute the balance of linear momentum for $\partial p/\partial n$, viz., $\partial p/\partial n = \omega^2 \rho u_n$, where $u_n$ is the amplitude of the normal component of particle displacement.

Making these substitutions, Eq. (26A) becomes $$\{F\} = -i\omega[C]\{P\} + \{D\} \qquad (28A)$$

where $$C_{ij} = \rho c \lim_{\hat{r}\to\infty} \int_{\hat{S}^{(e)}} \int \psi_i\psi_j dS \qquad (29A)$$

$$D_i = (\omega\rho c)^2 \lim_{\hat{r}\to\infty} \int\int_{S^{(e)} - \hat{S}^{(e)}} \psi_i\mu_n dS$$

The [C] matrix is the radiation damping matrix, representing radiation loss to infinity.

The {D} vector permits specification of $u_n$ on the side or bottom faces of the element. These faces are either on the boundary of, or interior to, the domain.

Face on boundary of domain: A nonzero value corresponds to a moving boundary with a known normal displacement (or velocity) amplitude. Along the side faces, a nonzero $u_n$ must decay fast enough in the radial direction for the integral in Eq. (29A) to be finite.

A zero value corresponds to a rigid boundary, i.e., motion permitted parallel to the boundary but not perpendicular to it. Perhaps the most common occurrence of a rigid infinite boundary is when there is a plane of symmetry through the structure and fluid, permitting the analyst to model only the structure and fluid on one side of the plane, i.e., an infinite half-space problem. A plane of symmetry occurs when all passive system properties (geometry, constraints, material properties and, if present, hydrostatic prestresses) are symmetric with respect to a plane. If the excitation is also symmetric, or just the symmetric component of an asymmetric excitation is being considered, then the system response must possess the same symmetry. Therefore, vector quantities must be a mirror reflection across the plane. In the case of particle displacement, this means that the normal component must vanish, in order to preserve material continuity.

Face in interior of domain: Every interior face is common to two adjacent infinite or finite-size acoustic elements. Assembly of the {D} vectors from two adjacent elements yields, on the interface, a sum of two surface integrals with opposite sign because the outward normals are in opposite directions. The pair of integrals therefore represents the difference of $u_n$ across the interface. A nonzero difference corresponds to a jump discontinuity in the normal displacement, i.e., a separation of the fluid. A zero difference corresponds to preservation of material continuity, the usual condition in practical applications.

Substituting Eq. (28A) into Eq. (24A) yields for the element matrix equation:

$$([K]+i\omega[C]-\omega^2[M])\{P\}=\{D\} \qquad (30A)$$

where, summarizing, the stiffness, mass and radiation damping matrices are, respectively, $$K_{ij} = \lim_{\hat{r}\to\infty} \int_{V^{(e)}}\int\int B\nabla\psi_i \cdot \nabla\psi_j dV \qquad (31A)$$

$$M_{ij} = \lim_{\hat{r}\to\infty} \int_{V^{(e)}}\int\int \rho\psi_i\psi_j dV$$

$$C_{ij} = \rho c \lim_{\hat{r}\to\infty} \int_{\hat{S}^{(e)}}\int \psi_i\psi_j dS$$

The remainder of Section IIID transforms the integrals in Eq. (31A) to expressions that can be numerically evaluated. (The author's IEM code has so far only used zero values for $D_i$ in the infinite elements in all applications.)

2. Transformation of Integrals to Prolate Spheroidal Coordinates

The differential volume and surface elements are $dV=J_V dr d\theta d\phi$ and $dS=J_S d\theta d\phi$, where $J_V$ is the volume Jacobian and $J_S$ is the surface Jacobian (on spheroids). Since the faces of the infinite element conform to spheroids ($\theta,\phi$-surfaces) and hyperbolas (r-lines), the integration limits for the volume integrals can be separated into angular limits and radial limits. Thus, Eq. (31A) becomes $$K_{ij} = \lim_{\hat{r}\to\infty} \int_{\sigma^{(e)}}\int \int_{r_1}^{\hat{r}} B\nabla\psi_i \cdot \nabla\psi_j J_V dr d\theta d\phi \qquad (32A)$$

$$M_{ij} = \lim_{\hat{r}\to\infty} \int_{\sigma^{(e)}}\int \int_{r_1}^{\hat{r}} \rho\psi_i\psi_j J_V dr d\theta d\phi$$

$$C_{ij} = \rho c \lim_{\hat{r}\to\infty} \int_{\sigma^{(e)}}\int \psi_i\psi_j J_S d\theta d\phi$$

where $\sigma^{(e)}$ is the "spheroidal cross section" of the element, i.e., any confocal spheroidal surface inside the element and bounded by the side faces. There is only one spheroidal cross section in $r,\theta,\phi$-space because the $\theta,\phi$ coordinates of the boundary of the cross section are independent of r. Hence, $\hat{S}^{(e)}$ is equivalent to $\sigma^{(e)}$ in the surface integration for $C_{ij}$. The transformation of $d_V$, $d_S$ and $\nabla$ to prolate spheroidal coordinates is as follows.

Volume Jacobian $$J_V = \frac{\partial d}{\partial r}\cdot\frac{\partial d}{\partial\theta}\times\frac{\partial d}{\partial\phi} = h_r a_r \cdot h_\theta a_\theta \times h_\phi a_\phi = h_r h_\theta h_\phi \qquad (33A)$$

where $d=xi+yj+zk$ is the position vector and $a_r, a_\theta, a_\phi$ are unit vectors, with dimensions of length, in the $r,\theta,\phi$ directions, respectively. For orthogonal coordinates, $a_r \cdot a_\theta \times a_\phi = 1$. The scale factors $h_r, h_\theta$ and $h_\phi$ are given by $$h_u = \left|\frac{\partial d}{\partial u}\right| = \sqrt{\left(\frac{\partial x}{\partial u}\right)^2 + \left(\frac{\partial y}{\partial u}\right)^2 + \left(\frac{\partial z}{\partial u}\right)^2} \qquad (34A)$$

$$u = r, \theta, \phi$$

Using Eq. (5A) yields $$h_r = \sqrt{\frac{r^2-f^2\cos^2\theta}{r^2-f^2}} \qquad (35A)$$

$$h_\theta = \sqrt{r^2-f^2\cos^2\theta}$$

$$h_\phi = \sqrt{r^2-f^2}\,\sin\theta$$

and Eq. (33A) becomes $$J_V = r^2\sin\theta - f^2\cos^2\theta\sin\theta \qquad (36A)$$

Surface Jacobian $J_S$ is needed in $C_{ij}$ only on the outer face, i.e., on the spheroid at $r=\hat{r}$, $$J_S(\hat{r}) = \left|\frac{\partial d}{\partial\theta}\times\frac{\partial d}{\partial\phi}\right|_{\hat{r}} = |h_\theta a_\theta\times h_\phi a_\phi|_{\hat{r}} = h_\theta(\hat{r})h_\phi(\hat{r}) \qquad (37A)$$

$$= \sqrt{\hat{r}^2-f^2\cos^2\theta}\,\sqrt{\hat{r}^2-f^2}\,\sin\theta$$

and it is needed only in the limit as $\hat{r}\to\infty$ (while f remains constant). Hence, $$\lim_{\hat{r}\to\infty} J_S = \hat{r}^2\sin\theta \qquad (38A)$$

which is the same as the surface Jacobian in spherical coordinates because prolate spheroidal coordinates→spherical coordinates as $\hat{r}\to\infty$.

Gradient $$\nabla = a_r\frac{1}{h_r}\frac{\partial}{\partial r} + a_\theta\frac{1}{h_\theta}\frac{\partial}{\partial\theta} + a_\phi\frac{1}{h_\phi}\frac{\partial}{\partial\phi} \qquad (39A)$$

The gradient is needed only in $K_{ij}$, where it occurs as $\nabla\psi_i \cdot \nabla\psi_j J_V$. Using Eqs. (35A), (36A) and (39A) yields $$\nabla \psi_i \cdot \nabla \psi_j J_V = r^2 \sin\theta \frac{\partial \psi_i}{\partial r} \frac{\partial \psi_j}{\partial r} + \sin\theta \frac{\partial \psi_i}{\partial \theta} \frac{\partial \psi_j}{\partial \theta} + \qquad (40A)$$

$$\frac{1}{\sin\theta} \frac{\partial \psi_i}{\partial \phi} \frac{\partial \psi_j}{\partial \phi} - f^2 \sin\theta \frac{\partial \psi_i}{\partial r} \frac{\partial \psi_j}{\partial r} +$$

$$\frac{f^2}{r^2 - f^2} \sin\theta \frac{\partial \psi_i}{\partial \phi} \frac{\partial \psi_j}{\partial \phi}$$

Eqs. (40A), (36A) and (38A) can now be substituted into $K_{ij}$, $M_{ij}$ and $_{ij}$, respectively, in Eq. (32A). In addition, Eq. (12) is substituted for $\psi_i$ and $\psi_j$, introducing primes to distinguish the indices $\nu$ and $g$ that are associated with the index i:

$$\psi_i(\xi,\eta,r) = \psi_\nu{}^a(\xi,\eta)\psi_\mu{}^r(r)$$

$$\psi_j(\xi,\eta,r) = \psi_{\nu'}{}^a(\xi,\eta)\psi_{\mu'}{}^r(r) \qquad (41A)$$

Performing these substitutions, and noting that the angular shape functions are implicitly functions of $\theta,\phi$ [because of the coordinate mapping in Eq. (7)], all the 3-D integrals separate into products of 2-D "angular" integrals, $A_{\nu'\nu}{}^{(i)}$, and 1-D "radial" integrals, $R_{\mu'\mu}{}^{(i)}$. The 2-D surface integral for $C_{ij}$ separates in a similar manner. The resulting expressions are as follows.

$$K_{ij} = B(A_{\nu'\nu}^{(1)}\bar{R}_{\mu'\mu}^{(1)} + A_{\nu'\nu}^{(2)}R_{\mu'\mu}^{(2)} - \epsilon_1^2 A_{\nu'\nu}^{(1)}R_{\mu'\mu}^{(3)} + \epsilon_1^2 A_{\nu'\nu}^{(3)}R_{\mu'\mu}^{(4)}) \qquad (42A)$$

$$M_{ij} = \rho r_1^2 (A_{\nu'\nu}^{(1)}\bar{R}_{\mu'\mu}^{(5)} - \epsilon_1^2 A_{\nu'\nu}^{(4)}R_{\mu'\mu}^{(2)})$$

$$C_{ij} = \rho c A_{\nu'\nu}^{(1)} \cdot \lim_{r \to \infty} [\psi_{\mu'}^r \psi_\mu^r]\hat{r}^2$$

where $$A_{\nu'\nu}^{(1)} = \int_{\tau^{(e)}} \int \psi_{\nu'}^\alpha \psi_\nu^\alpha \sin\theta d\theta d\phi \qquad (43A)$$

$$A_{\nu'\nu}^{(2)} = \int_{\tau^{(e)}} \int \left( \frac{\partial \psi_{\nu'}^\alpha}{\partial \theta} \frac{\partial \psi_\nu^\alpha}{\partial \theta} \sin\theta + \frac{\partial \psi_{\nu'}^\alpha}{\partial \phi} \frac{\partial \psi_\nu^\alpha}{\partial \phi} \frac{1}{\sin\theta} \right) d\theta d\phi$$

$$A_{\nu'\nu}^{(3)} = \int_{\tau^{(e)}} \int \frac{\partial \psi_{\nu'}^\alpha}{\partial \phi} \frac{\partial \psi_\nu^\alpha}{\partial \phi} \sin\theta d\theta d\phi$$

$$A_{\nu'\nu}^{(4)} = \int_{\tau^{(e)}} \int \psi_{\nu'}^\alpha \psi_\nu^\alpha \cos^2\theta \sin\theta d\theta d\phi$$

$$\bar{R}_{\mu'\mu}^{(1)} = \lim_{\hat{r} \to \infty} \int_{r_1}^{\hat{r}} r^2 \frac{d\psi_{\mu'}^r}{dr} \frac{d\psi_\mu^r}{dr} dr \qquad (44A)$$

$$R_{\mu'\mu}^{(2)} = \lim_{\hat{r} \to \infty} \int_{r_1}^{\hat{r}} \psi_{\mu'}^r \psi_\mu^r dr$$

$$R_{\mu'\mu}^{(3)} = \lim_{\hat{r} \to \infty} \int_{r_1}^{\hat{r}} r_1^2 \frac{d\psi_{\mu'}^r}{dr} \frac{d\psi_\mu^r}{dr} dr$$

$$R_{\mu'\mu}^{(4)} = \lim_{\hat{r} \to \infty} \int_{r_1}^{\hat{r}} \frac{r_1^2}{r^2 - f^2} \psi_{\mu'}^r \psi_\mu^r dr$$

$$\bar{R}_{\mu'\mu}^{(5)} = \lim_{\hat{r} \to \infty} \int_{r_1}^{\hat{r}} \frac{r^2}{r_1^2} \psi_{\mu'}^r \psi_\mu^r dr$$

and $$\epsilon_1 = \frac{f}{r_1} = \text{eccentricity of infinite element spheroid} \qquad (45A)$$

The symbols $\bar{R}_{\mu'\mu}^{(1)}$ and $\bar{R}_{\mu'\mu}^{(5)}$ include an overbar because a term will later be removed from each integral [cf. Eqs. (58A) and (73A)] and the remaining terms will be labeled $R_{\mu'\mu}^{(1)}$ and $R_{\mu'\mu}^{(5)}$ so that all five radial integrals will have uniform symbols (no overbars) in the final expressions [Eq. (82A)].

The tensor products $A_{\nu'\nu}R_{\mu'\mu}$ are N×N matrices that are constructed by multiplying each term in the m×m [R] matrix by the entire n×n [A] matrix, as shown in Eq. (46A). Above and to the left of the matrix are tables, reproduced from Table II, showing the relationship of the indices $\mu$ and $\nu$ to j, and $\mu'$ and $\nu'$ to i.

| j | 1 2 ... | ... | ... | ...N | (46a) |
|---|---------|-----|-----|------|-------|
| μ | 1 | 2 | ... | m | |
| ν | 1 2 ... n | 1 2 ... n | ... | 1 2 ... n | |

| i | μ' | ν' | | | | | |
|---|----|----|--|--|--|--|--|
| 1 | | 1 | | | | | |
| 2 | 1 | 2 | $R_{11}[A]$ | $R_{12}[A]$ | ... | $R_{1m}[A]$ | |
| . | | n | | | | | |
| . | | 1 | | | | | |
| . | 2 | 2 | | $R_{22}[A]$ | ... | $R_{2m}[A]$ | |
| . | | n | | | | | |
| . | | 1 | symmetric | | | $R_{mm}[A]$ | |
| . | m | 2 | | | | | |
| N | | n | | | | | |

3. Angular Integrals

Because of the coordinate mapping in Eq. (7), $d\theta d\phi = Jd\xi d\eta$, where the Jacobian is $$J = \begin{vmatrix} \frac{\partial \theta}{\partial \xi} & \frac{\partial \phi}{\partial \xi} \\ \frac{\partial \theta}{\partial \eta} & \frac{\partial \phi}{\partial \eta} \end{vmatrix} \qquad (47A)$$

Hence Eqs. (43A) become, $$A_{\nu'\nu}^{(1)} = \int_{\tau^{(e)}} \int \psi_{\nu'}^\alpha \psi_\nu^\alpha \sin\theta Jd\xi d\eta \qquad (48A)$$

$$A_{\nu'\nu}^{(2)} = \int_{\tau^{(e)}} \int \left( \frac{\partial \psi_{\nu'}^\alpha}{\partial \theta} \frac{\partial \psi_\nu^\alpha}{\partial \theta} \sin\theta + \frac{\partial \psi_{\nu'}^\alpha}{\partial \phi} \frac{\partial \psi_\nu^\alpha}{\partial \phi} \frac{1}{\sin\theta} \right) Jd\xi d\eta$$

$$A_{\nu'\nu}^{(3)} = \int_{\tau^{(e)}} \int \frac{\partial \psi_{\nu'}^\alpha}{\partial \phi} \frac{\partial \psi_\nu^\alpha}{\partial \phi} \sin\theta Jd\xi d\eta$$

-continued $$A_{v'v}^{(4)} = \int_{\tau(e)} \int \psi_{v'}^{\alpha} \psi_v^{\alpha} \cos^2\theta \sin\theta J d\xi d\eta$$

where $$\int_{\tau(e)} \int \ldots d\xi d\eta = \begin{cases} \int_{-1}^{1} \int_{-1}^{1} \ldots d\xi d\eta & \text{for quadrilaterals} \\ \int_{0}^{1} \int_{0}^{1-\eta} \ldots d\xi d\eta & \text{for triangles} \end{cases} \tag{49A}$$

All four integrals can be numerically integrated using Gauss rules since the integrands are smooth and bounded (including the $1/\sin\theta$ term because $J \propto \theta$ as $\theta \to 0$). The derivatives of $\psi_v^{\alpha}$ are evaluated in the conventional manner, $$\begin{Bmatrix} \dfrac{\partial \psi_v^{\alpha}}{\partial \theta} \\ \dfrac{\partial \psi_v^{\alpha}}{\partial \phi} \end{Bmatrix} = [J]^{-1} \begin{Bmatrix} \dfrac{\partial \psi_v^{\alpha}}{\partial \xi} \\ \dfrac{\partial \psi_v^{\alpha}}{\partial \eta} \end{Bmatrix} \tag{50A}$$

Indeed, the entire evaluation of the angular integrals follows conventional finite element analysis procedures.

4. Radial Integrals $\overline{R}_{\mu'\mu}^{(1)}$

From Eq. (16A), $$\frac{d\psi_{\mu}^{r}}{dr} = ke^{-ik(r-r_\mu)} \sum_{\alpha=1}^{m+1} \frac{\alpha_{\mu\alpha}}{(kr)^\alpha} \tag{51A}$$

where $$\alpha_{\mu\alpha} = -ih_{\mu\alpha} - (\alpha - 1)h_{\mu,\alpha-1} \tag{52A}$$
$\mu = 1,2,\ldots,m$
$\alpha = 1,2,\ldots,m+1$
and
$h_{\mu 0} = h_{\mu,m+1} = 0.$ $$\frac{d\psi_{\mu'}^{r}}{dr} \frac{d\psi_{\mu}^{r}}{dr} = k^2 e^{ik(r_{\mu'}+r_\mu)} \left( \sum_{\beta=2}^{2m+2} \frac{b_\beta}{(kr)^\beta} \right) e^{-i2kr} \tag{53A}$$

where $$b_\beta = \sum_{\gamma=1}^{\beta-1} \alpha_{\mu'\gamma} \alpha_{\mu,\beta-\gamma} \tag{54A}$$

and, from Eq. (52A), $a_{\mu\alpha}=0$ for $\alpha>m+1$.

Substituting Eq. (53A) into the first of Eqs. (44A) yields $$\overline{R}_{\mu'\mu}^{(1)} = \tag{55A}$$

$$L_{\mu'\mu} \lim_{\hat{r} \to \infty} \left[ b_2 \int_{r_1}^{\hat{r}} e^{-i2kr} k dr + \int_{r_1}^{\hat{r}} \left( \sum_{\beta=1}^{2m} \frac{b_{\beta+2}}{(kr)^\beta} \right) e^{-i2kr} k dr \right]$$

where $$L_{\mu'\mu} = \frac{1}{k} e^{ik(r_{\mu'}+r_\mu)} \tag{56A}$$

A factor k is introduced into the integrals (and cancelled by the $1/k$ in $L_{\mu'\mu}$) to make them dimensionless. The $b_2$ integral is separated from the others because the upper limit yields an undefined term (which will later be cancelled by similar terms from $M_{ij}$ and $C_{ij}$). Formally, we shall write $$\lim_{\hat{r} \to \infty} \int_{r_1}^{\hat{r}} e^{-i2kr} k dr = \lim_{\hat{r} \to \infty} \frac{i}{2} e^{-i2k\hat{r}} - \frac{i}{2} e^{-i2kr_1} \tag{57A}$$

The other integrals are well defined, so the limiting process only requires changing the upper limit from $\hat{r}$ to $\infty$. Eq. (55A) becomes $$\overline{R}_{\mu'\mu}^{(1)} = L_{\mu'\mu} \frac{b_2 i}{2} \lim_{\hat{r} \to \infty} e^{-i2k\hat{r}} + R_{\mu'\mu}^{(1)} \tag{58A}$$

where $$R_{\mu'\mu}^{(1)} = L_{\mu'\mu} \left[ -\frac{b_2 i}{2} e^{-i2\zeta} + \sum_{\beta=1}^{2m} b_{\beta+2} I_\beta \right], \tag{59A}$$

$$\zeta = kr_1, \tag{60A}$$

and $$I_\beta = \int_{r_1}^{\infty} \frac{e^{-i2kr}}{(kr)^\beta} k dr \tag{61A}$$

$\beta \geq 1$

The $I_\beta$ integrals can be evaluated two ways.
(i) Sine and Cosine Integrals For $\beta = 1$, $$I_1 = Ci(2\zeta) + iSi(2\zeta) - \frac{i\pi}{2} \tag{62A}$$

where Si and Ci are the well known sine and cosine integrals. For $\beta>1$, integration of $I_\beta$ by parts yields the recursion relation $$I_\beta = \frac{e^{-i2\zeta}}{(\beta-1)\zeta^{\beta-1}} - \frac{2i}{\beta-1} I_{\beta-1}, \tag{63A}$$

$\beta > 1$ (ii) Fourier Sine and Cosine Transforms
Making the change of variable $$x = kr - \zeta \tag{64A}$$

Eq. (61A) becomes $$I_\beta = e^{-i2\zeta} \left[ \int_0^\infty \frac{\cos 2x}{(x+\zeta)^\beta} dx - i \int_0^\infty \frac{\sin 2x}{(x+\zeta)^\beta} dx \right] \tag{65A}$$

The author used the second approach in his IEM code because of the availability of a Fourier sine and cosine transform routine, which was also used for the more complicated $J_\mu$ integral for $R_{\mu'\mu}^{(4)}$ below.

$\overline{R}_{m'm}^{(2)}$

From Eq. (16), $$\psi_{\mu'}^{r},\psi_{\mu}^{r} = L_{\mu'\mu} \left( \sum_{\beta=2}^{2m} \frac{c_\beta}{(kr)^\beta} \right) e^{-i2kr_k} \tag{66A}$$

where $$c_\beta = \sum_{\gamma=1}^{\beta-1} h_{\mu'\gamma} h_{\mu,\beta-\gamma} \tag{67A}$$

and $h_{\mu\alpha}=0$ for $\alpha>m$. Substituting Eq. (66A) into the second of Eqs. (44A) and letting the upper limit be $\infty$, since all integrals are well defined, yields $$R_{\mu'\mu}^{(2)} = L_{\mu'\mu} \sum_{\beta=2}^{2m} c_\beta I_\beta \tag{68A}$$

$R_{m'm}^{(3)}$

Substituting Eq. (53A) into the third of Eqs. (44A) and letting the upper limit be ∞, since all integrals are well defined, yields $$R_{\mu'\mu}^{(3)} = \zeta^2 L_{\mu'\mu} \sum_{\beta=2}^{2m+2} b_\beta I_\beta \tag{69A}$$

$R_{m'm}^{(4)}$

Substituting Eq. (66A) into the fourth of Eqs. (44A) and letting the upper limit be ∞, since all integrals are well defined, yields $$R_{\mu'\mu}^{(4)} = \zeta^2 L_{\mu'\mu} \sum_{\beta=2}^{2m} c_\beta J_\beta \tag{70A}$$

where $$J_B = \int_{r_1}^{\infty} \frac{e^{-i2kr}}{[(kr)^2 - \epsilon_1^2 \zeta^2](kr)^\beta} \, k dr \; \beta \geq 2 \tag{71A}$$

The denominator does not vanish because $[(kr)^2 - \epsilon_1^2 \zeta^2] = k^2(r^2 - f^2)$ and $r \leq r_1 > f$. Using Eq. (64A) converts $J_\mu$ to Fourier sine and cosine transforms, $$J_\beta = e^{-i2\zeta} \left[ \int_0^{\infty} \frac{\cos 2x}{[(x+\zeta)^2 - \epsilon_1^2 \zeta^2](x+\zeta)^\beta} \, dx - i \int_0^{\infty} \frac{\sin 2x}{[(x+\zeta)^2 - \epsilon_1^2 \zeta^2](x+\zeta)^\beta} \, dx \right] \tag{72A}$$

which can be evaluated with the same routine used for the $I_\beta$ integrals in Eq. (65A).

$\overline{R}_{m'm}^{(5)}$

Substituting Eq. (66A) into the fifth of Eqs. (44A) and proceeding in the same manner as for $\overline{R}_{\mu'\mu}^{(1)}$ (viz. separating the $c_2$ integral from the others because the upper limit produces an undefined oscillatory term) yields $$\overline{R}_{\mu'\mu}^{(5)} = \frac{1}{\zeta^2} L_{\mu'\mu} \frac{c_2 i}{2} \lim_{\hat{r} \to \infty} e^{-i2k\hat{r}} + R_{\mu'\mu}^{(5)} \tag{73A}$$

where $$R_{\mu'\mu}^{(5)} = \frac{1}{\zeta^2} L_{\mu'\mu} \left[ -\frac{c_2 i}{2} e^{-i2\zeta} + \sum_{\beta=1}^{2m-2} c_{\beta+2} I_\beta \right] \tag{74A}$$

5. Radial Functions on Outer Face

The radiation damping matrix, $C_{ij}$, in Eq. (42A) includes the term $$\lim_{\hat{r} \to \infty} [\psi_{\mu'}{}', \psi_{\mu'}{}'] \hat{r}^2.$$

Using Eq. (66A), $$\lim_{\hat{r} \to \infty} [\psi_{\mu'}{}', \psi_{\mu'}{}'] \hat{r}^2 = \lim_{\hat{r} \to \infty} \frac{1}{k} L_{\mu'\mu} \left( \sum_{\beta=2}^{2m} \frac{c_\beta}{(k\hat{r})^\beta} \right) e^{-i2k\hat{r}} (k\hat{r})^2 \tag{75A}$$

Taking the limit as $\hat{r} \to \infty$ eliminates all the $c_\beta$ terms except $c_2$, which contains an undefined oscillatory term:

$$\lim_{\hat{r} \to \infty} [\psi_{\mu'}{}', \psi_{\mu'}{}'] \hat{r}^2 = L_{\mu'\mu} \frac{c_2}{k} \lim_{\hat{r} \to \infty} e^{-i2k\hat{r}} \tag{76A}$$

6. Vanishing of Undefined Oscillatory Terms

The expressions for all the radial integrals [Eqs. (58A), (59A), (68A), (69A), (70A), (73A) and (74A)] and the radial functions on the outer face [Eq. (76A)] can now be substituted into the stiffness, mass and damping matrices in Eq. (42A). Adding those three matrices together as in the element matrix equation, Eq. (30A), yields $[K] + i\omega[C] - \omega^2[M] = [K^\infty] - \omega^2[M^\infty] + \text{undefined oscillatory terms} \tag{77A}$ where $[K^\infty]$ and $[M^\infty]$ comprise all the well-defined integrals and are summarized in the next section. The "undefined oscillatory terms" comprise all terms containing the expression $\lim e^{-i2k\hat{r}}$. There are three such occurrences: Eqs. (58A), (73A) and (76A), which contribute to [K], [C] and [M], respectively. Thus, $$\text{undefined oscillatory terms} = B A_{\nu'\nu}^{(1)} L_{\mu'\mu} \frac{b_2 i}{2} \lim_{\hat{r} \to \infty} e^{-i2k\hat{r}} + \tag{78A}$$

$$i\omega\rho c A_{\nu'\nu}^{(1)} L_{\mu'\mu} \frac{c_2}{k} \lim_{\hat{r} \to \infty} e^{-i2k\hat{r}} - \omega^2 \rho r_1 A_{\nu'\nu}^{(1)} L_{\mu'\mu} \frac{c_2 i}{2\zeta^2} \lim_{\hat{r} \to \infty} e^{-i2k\hat{r}} =$$

$$(b_2 + c_2) B \frac{i}{2} A_{\nu'\nu}^{(1)} L_{\mu'\mu} \lim_{\hat{r} \to \infty} e^{-i2k\hat{r}}$$

using $\omega = ck$ and $c^2 = B/\rho$. From Eqs. (52A) and (54A), $b_2 = a_{\mu'1} a_{\mu 1} = -h_{\mu'1} h_{\mu 1}$, and from Eq. (67A), $c_2 = h_{\mu'1} h_{\mu 1} = -b_2$. Hence, $$\text{undefined oscillatory terms} = 0. \tag{79A}$$

In words, the stiffness and mass matrices consist of two types of terms: those that are independent of the location of the outer face (the "well-defined" integrals) and those that do depend on its location and therefore oscillate as the face recedes to infinity. The damping matrix, which represents application of the Sommerfeld radiation condition to the outer face, is completely oscillatory. Eq. (79A) states that the radiation condition exactly cancels the oscillatory terms in the stiffness and mass matrices.

7. Final Expressions

From Eqs. (77A) and (79A) it follows that the final form of the element matrix equation for the infinite acoustic element is $$([K^\infty] - \omega^2[M^\infty])\{P\} = \{D\} \tag{80A}$$

where $$K_{ij}^\infty = B(A_{\nu'\nu}^{(1)} R_{\mu'\mu}^{(1)} + A_{\nu'\nu}^{(2)} R_{\mu'\mu}^{(2)} - \epsilon_1^2 A_{\nu'\nu}^{(1)} R_{\mu'\mu}^{(3)} + \epsilon_1^2 A_{\nu'\nu}^{(3)} R_{\mu'\mu}^{(4)}) \tag{81A}$$

$$M_{ij}^\infty = \rho r_1{}^2 (A_{\nu'\nu}^{(1)} R_{\mu'\mu}^{(5)} - \epsilon_1^2 A_{\nu'\nu}^{(4)} R_{\mu'\mu}^{(2)})$$

The vector $\{D\}$ is given in Eq. (29A); it is zero in almost all practical applications. The angular integrals, $A_{\nu'\nu}^{(i)}$, $i=1,2,3,4$, are given in Eq. (48A). The radial integrals are $$R_{\mu'\mu}^{(1)} = L_{\mu'\mu} \left[ -\frac{i}{2} b_2 e^{-i2\zeta} + \sum_{\beta=1}^{2m} b_{\beta+2} I_\beta \right] \tag{82A}$$

$$R_{\mu'\mu}^{(2)} = L_{\mu'\mu} \sum_{\beta=2}^{2m} c_\beta I_\beta$$

$$R_{\mu'\mu}^{(3)} = L_{\mu'\mu} \zeta^2 \sum_{\beta=2}^{2m+2} b_\beta I_\beta$$

$$R_{\mu'\mu}^{(4)} = L_{\mu'\mu} \zeta^2 \sum_{\beta=2}^{2m} c_\beta J_\beta$$

$$R_{\mu'\mu}^{(5)} = L_{\mu'\mu} \frac{1}{\zeta^2} \left[ -\frac{i}{2} c_2 e^{-i2\zeta} + \sum_{\beta=1}^{2m-2} c_{\beta+2} I_\beta \right]$$

and $L_{\mu'\mu}$, $I_\beta$, $J_\beta$, $b_\beta$, $c_\beta$, and $\zeta$ are given by Eqs. (56A), (61A), (71A), (54A), (67A) and (60A), respectively. Eqs. (54A) and (67A), in turn, need $h_{\mu\alpha}$, which are determined by Eq. (20).

The radial integrals in Eq. (82A) are identical for every infinite element in a mesh (because they are independent of angular variables and are along identical prolate radial paths, i.e., hyperbolas emanating from the same spheroid), so they only need to be evaluated once for a given problem; their computational cost is totally insignificant. Hence, the numerical integration required to generate $[K^\infty]$ and $[M^\infty]$ for each infinite element involves only the evaluation of the 2-D angular integrals, making these 3-D elements as cheap to generate as 2-D elements. In addition, since the frequency dependence of the element is contained only in the radial integrals, element generation during a frequency sweep is essentially free after the first frequency.

We claim:

1. A method for predicting an acoustic field of a body surrounded by a fluid medium and subjected to given driving conditions, comprising:

a) constructing an inner boundary of the fluid medium, such that said inner boundary surrounds the body;

b) constructing a prolate spheroid, wherein the prolate spheroid is a bounding spheroid, which encloses the inner fluid boundary;

c) filling a space surrounding the bounding spheroid with infinite elements, wherein: (i) each infinite element is bounded by a base, at least three side faces, and an outer face; (ii) each respective base lies on the bounding spheroid; (iii) each respective outer face belongs to a prolate spheroidal surface confocal with the bounding spheroid; (iv) each respective side face is a locus of hyperbolas confocal with the bounding spheroid; and (v) the outer face recedes to an infinite prolate radius;

d) specifying an element matrix equation for each infinite element;

e) assembling the respective element matrix equations into a system matrix equation; and f) solving the system matrix equation.

2. The method of claim 1, further comprising:

constructing at least one intermediate layer of finite elements between the inner fluid boundary and the bounding spheroid.

3. The method of claim 1, wherein the bounding spheroid coincides with the inner fluid boundary.

4. The method of claim 1, further comprising:

a) constructing a geometrical representation of the body; and b) subdividing the body representation into finite elements.

5. The method of claim 1, wherein the bounding spheroid has an eccentricity greater than zero.

6. The method of claim 1, wherein the bounding spheroid is a minimal prolate spheroid about the inner fluid boundary.

7. The method of claim 1, further comprising, before solving the system matrix equation, adding to said equation loads and boundary conditions subject to which the body is to be driven.

8. The method of claim 1, further comprising, after solving the system matrix equation, displaying a graphical image that conveys information resulting from the solving step.

* * * * *